United States Patent [19]

Iwahashi

[11] Patent Number: 5,793,690

[45] Date of Patent: Aug. 11, 1998

[54] SEMICONDUCTOR MEMORY DEVICE CAPABLE OF STORING PLURAL-BIT DATA IN A SINGLE MEMORY CELL

[75] Inventor: Hiroshi Iwahashi, Yokohama, Japan

[73] Assignee: Kabushiki Kaisha Toshiba, Tokyo, Japan

[21] Appl. No.: 891,959

[22] Filed: Jul. 14, 1997

Related U.S. Application Data

[62] Division of Ser. No. 382,491, Feb. 1, 1995, Pat. No. 5,650,656.

[30] Foreign Application Priority Data

Feb. 2, 1994 [JP] Japan ................................ 6-011029

[51] Int. Cl.[6] ................................................ G11C 11/34
[52] U.S. Cl. .................... 365/210; 365/205; 365/185.09; 365/185.2; 365/185.21; 365/185.24
[58] Field of Search ....................... 365/185.01, 205, 365/210, 185.09, 185.2, 185.21, 185.24

[56] References Cited

U.S. PATENT DOCUMENTS

| | | |
|---|---|---|
| 4,449,203 | 5/1984 | Adlhoch . |
| 4,495,602 | 1/1985 | Sheppard . |
| 4,604,732 | 8/1986 | Van Tran . |
| 5,012,448 | 4/1991 | Matsuoka et al. ................. 365/208 |
| 5,127,791 | 7/1992 | Haken ................................ 365/182 |
| 5,311,463 | 5/1994 | Taji ...................................... 365/51 |
| 5,407,844 | 4/1995 | Snayling et al. .................. 438/234 |
| 5,411,908 | 5/1995 | Santin et al. ...................... 438/263 |
| 5,504,708 | 4/1996 | Satin et al. ..................... 365/185.18 |
| 5,506,805 | 4/1996 | Hirose et al. ...................... 365/203 |

FOREIGN PATENT DOCUMENTS

| | | |
|---|---|---|
| 448141 | 9/1991 | European Pat. Off. . |
| 59-148360 | 8/1984 | Japan . |
| 61-67256 | 4/1986 | Japan . |
| 2084828 | 4/1982 | United Kingdom . |
| 8001119 | 5/1989 | WIPO . |

OTHER PUBLICATIONS

"Mid–Level Current Generator Circuit", IBM Technical Disclosure Bulletin, vol. 33, No. 1B, Jun. 1990, pp. 386–388.

*Primary Examiner*—Viet Q. Nguyen
*Attorney, Agent, or Firm*—Loeb & Loeb LLP

[57] ABSTRACT

Each of memory cells has one MOS transistor including a drain region, a source region, a channel region and a gate electrode. An impurity-introducing area of the channel region is varied in the width direction of the channel region to store data of plural bits in the memory cell.

6 Claims, 15 Drawing Sheets

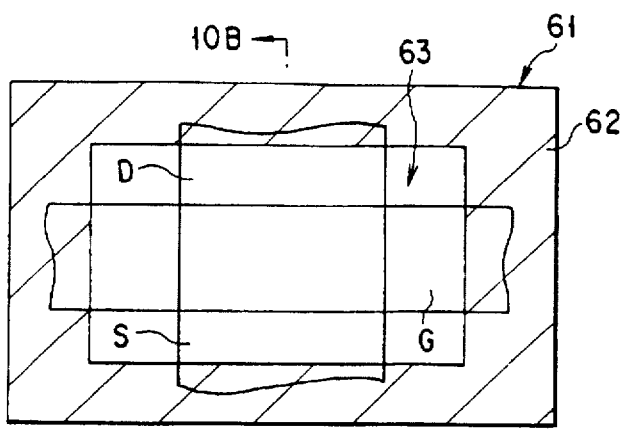
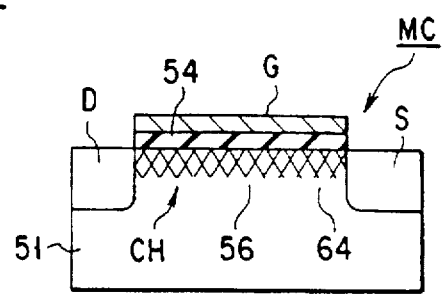
FIG. 10A     FIG. 10B
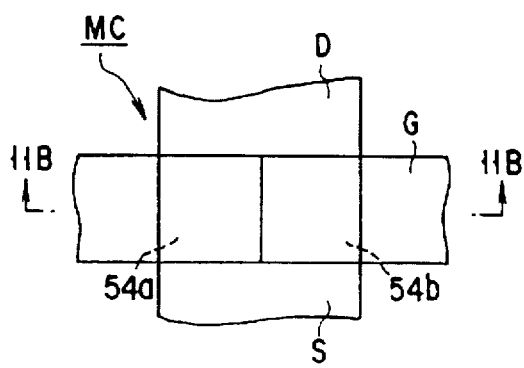
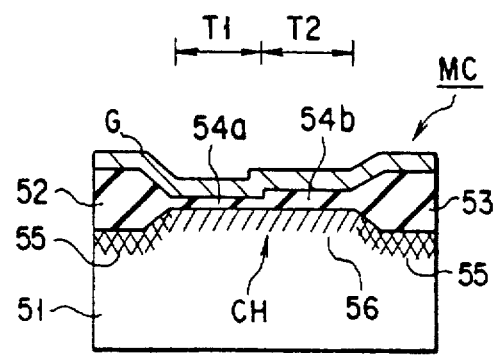
FIG. 11A     FIG. 11B
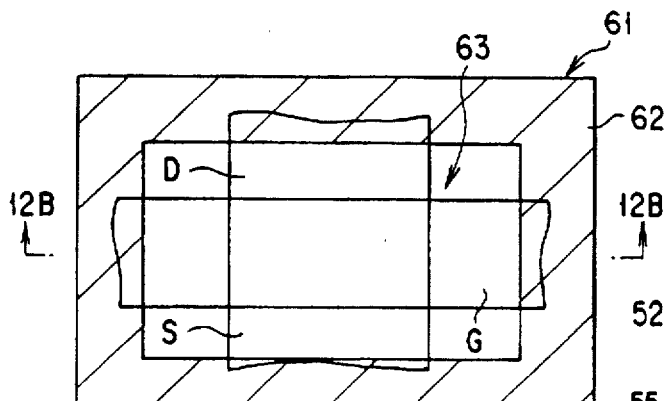
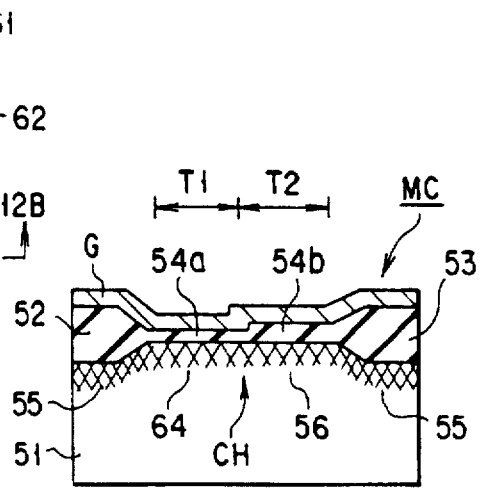
FIG. 12A     FIG. 12B

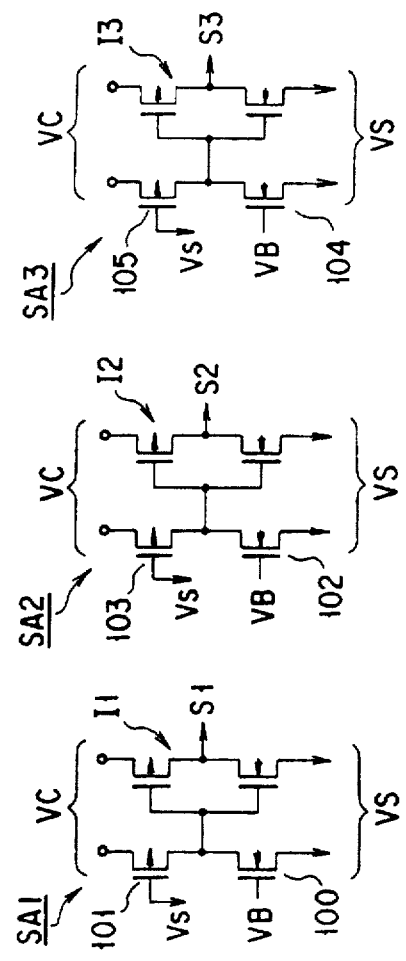
FIG. 18A   FIG. 18B   FIG. 18C
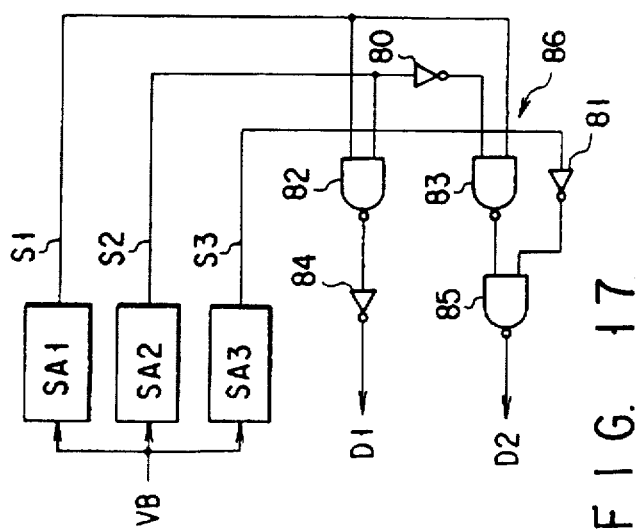
FIG. 17
| STORAGE STATUS OF MEMORY CELL | THRESHOLD VOLTAGE(V) OF MEMORY CELL | VOLTAGE(V) OF SELECTED BIT LINE | S1 | S2 | S3 | D1 | D2 |
|---|---|---|---|---|---|---|---|
| 00 | 6 | 0 | 0 | 0 | 0 | 0 | 0 |
| 01 | 3.5 | 1.5 | 1 | 0 | 0 | 0 | 1 |
| 10 | 2 | 3 | 1 | 1 | 0 | 1 | 0 |
| 11 | 0 | 5 | 1 | 1 | 1 | 1 | 1 |
FIG. 19

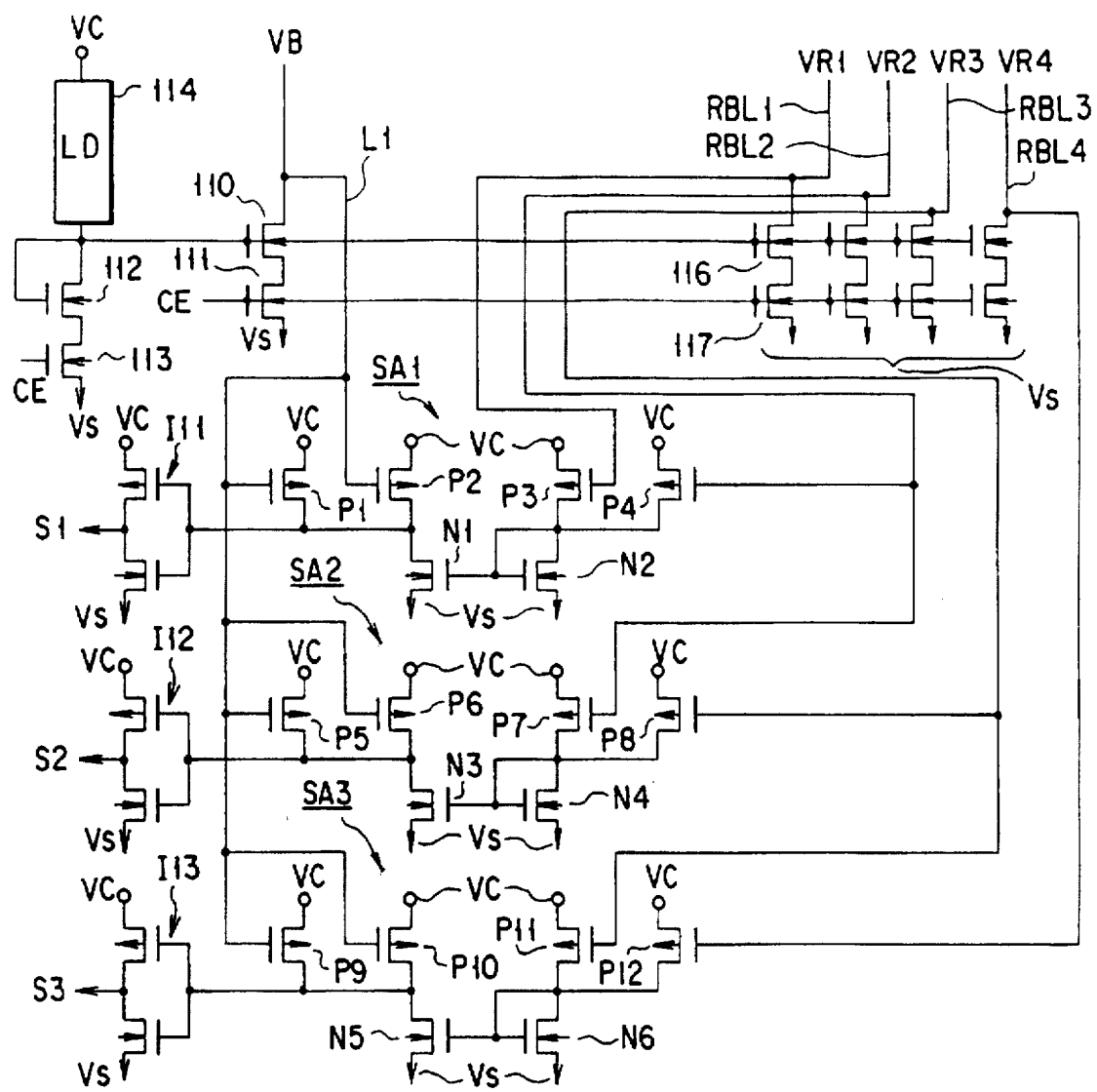
FIG. 21
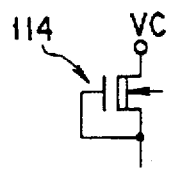
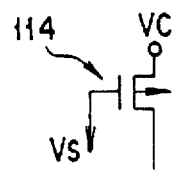
FIG. 22A   FIG. 22B

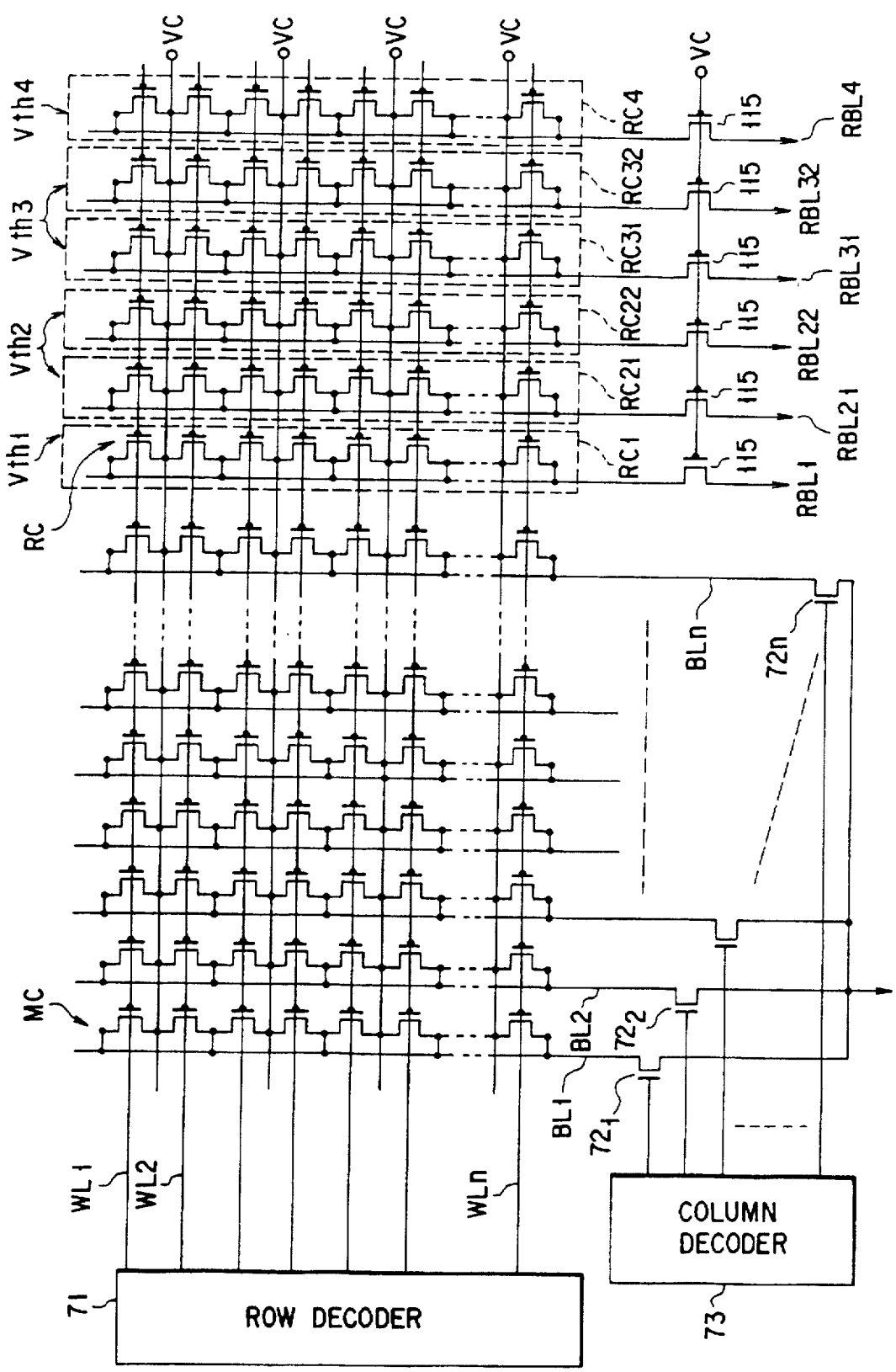
F I G. 23

| D0 | D1 | THRETHOLD VOLTAGE |
|---|---|---|
| 0 | 0 | Vth4 |
| 0 | 1 | Vth3 |
| 1 | 1 | Vth2 |
| 1 | 0 | Vth1 |

SEMICONDUCTOR MEMORY DEVICE CAPABLE OF STORING PLURAL-BIT DATA IN A SINGLE MEMORY CELL

This is a divisional of application Ser. No. 08/382,491, filed Feb. 1, 1995, now U.S. Pat. No. 5,650,656.

BACKGROUND OF THE INVENTION

1. Field of the Invention

The present invention relates to a semiconductor memory device for storing data of plural bits in a single memory cell constituted by a single transistor.

2. Description of the Related Art

In a conventional read-only memory (ROM), one memory cell is constituted by one transistor. There are two methods of storing data in each memory cell. In a first method, data is stored in the memory cell by selecting either a high-level or low-level threshold voltage (Vth) of the transistor as the memory cell. In a second method, whether data is stored in the memory cell is determined by whether the drain of the transistor as the memory cell is connected to a column line or not.

When data is stored by the first method, the data can be read by applying a predetermined potential to a row line connected to the gate of the associated memory cell transistor. In this case, the transistor with the high-level threshold voltage is turned off and the transistor with the low-level threshold voltage is turned on. Thus, data "1" or data "0" is read from the memory cell. When data is stored by the second method, the data can be similarly read by applying a predetermined potential to the row line.

When a predetermined potential is applied to the row line, the transistor is rendered conductive. If the drain of the transistor is connected to the column line, the column line is discharged through this memory cell transistor. If the drain is not connected to the column line, the column line is not discharged even if the memory cell transistor is rendered conductive. Thus, the column line has two potential levels, i.e. a discharged level and a charged level, depending on whether the drain of the memory cell transistor is connected to the column line. Thereby, data "1" or data "0" is read out.

In either method, however, data of only one bit can be stored in one memory cell. Thus, in the prior art, in order to increase the memory capacity, the chip size increases inevitably.

In order to reduce the chip size, a memory cell in which data of two bits is stored has been proposed. FIG. 27 shows an example of this type of conventional semiconductor memory device. The data of two bits is stored in a single memory cell.

In FIG. 27, reference numeral 1 denotes a column decoder for decoding column address signals $a_0$, $/a_0$, $a_1$, $/a_1$, ...; numeral 2 denotes insulated gate type field effect transistors (hereinafter referred to as "MOS transistors") for column selection, which are controlled by decode outputs from the column decoder 1;

numeral 3 denotes column lines; numeral 4 denotes a row decoder for decoding row address signals $A_1$, $/A_1$, $A_2$, $/A_2$, ..., excluding lowest-bit signals $A_0$ and $/A_0$; numeral 5 denotes row lines; numeral 6 denotes MOS transistors constituting memory cells driven selectively by the row lines 5; numeral 7 denotes a load MOS transistor for charging the column lines 3; and symbol P denotes a common node of the MOS transistors 2. The MOS transistors 2 and 6 are N-channel enhancement type transistors, and the transistor 7 is an N-channel depletion type or a P-channel enhancement type transistor.

As is shown in FIG. 28, for example, the threshold voltage Vth of each memory cell transistor 6 is preset at one of four threshold voltages Vth1 to Vth4 (Vth4<Vth3<Vth2<Vth1) in accordance with data units D0 and D1 of two bits to be stored.

FIG. 29 shows the structure of a circuit for outputting data stored in each memory cell by detecting the potential of each column line 3. In FIG. 29, a terminal 11 is connected to the common node P of the column selection transistors 2.

A potential generating circuit 12 comprises an enhancement type MOS transistor 15, an enhancement type MOS transistor 16 and a depletion type MOS transistor 17. The threshold voltage of the transistor 15 is set at one of the aforementioned four thresholds, i.e. Vth4. A power supply voltage VC is constantly applied to the gate of the transistor 15, and the transistor 15 is equivalent to the selected memory cell transistor 6 having the threshold voltage Vth4. The enhancement type MOS transistor 16 has the same dimensions as the column selection MOS transistor 2, and the transistor 16 is normally set in the on-state with voltage VC applied to the gate thereof. The depletion type MOS transistor 17 has the same dimensions as the load MOS transistor 7. The potential generating circuit 12 generates a potential $V_1$ equal to the potential of the node P at the time the column line 3 has been discharged through the memory cell transistor 6 having the threshold voltage Vth4.

Like the potential generating circuit 12, potential generating circuits 13 and 14 generate potentials $V_2$ and $V_3$, respectively. The potentials $V_2$ and $V_3$ are equal to the potential of the column line 3 at the time the column line 3 has been discharged through the memory cell transistor 6 having the threshold voltage Vth3 and Vth2, respectively. In the potential generating circuit 13, the MOS transistor 15 is replaced with an enhancement type MOS transistor 18 set at the threshold voltage Vth3. In the potential generating circuit 14, an enhancement type MOS transistor 19 set at the threshold voltage Vth2 is substituted. The generated voltages $V_1$ to $V_3$ have the relationship, $V_1<V_2<V_3$.

Each of the voltage comparing circuits 20, 21 and 22 comprises two enhancement type MOS transistors 23 and 24 and depletion type MOS transistors 25 and 26. The voltage comparing circuit 20 compares potential Vp at the node P applied to the terminal 11 with the output potential $V_1$ of the potential generating circuit 12. When the potential Vp is equal to or lower than $V_1$, the potential comparing circuit 20 outputs a "1"-level signal a, and when the potential Vp is higher than $V_1$, it outputs a "0"-level signal a. The voltage comparing circuit 21 compares the potential Vp at node P with the output potential $V_2$ of the potential generating circuit 13. When the potential Vp is equal to or lower than $V_2$, the potential comparing circuit 21 outputs a "1"-level signal b, and when the potential Vp is higher than $V_2$, it outputs a "0"-level signal b. The voltage comparing circuit 22 compares the potential Vp at node P with the output potential $V_3$ of the potential generating circuit 14. When the potential Vp is equal to or lower than $V_3$, the potential comparing circuit 22 outputs a "1"-level signal c, and when the potential Vp is higher than $V_3$, it outputs a "0"-level signal c.

Reference numerals 27, 28 and 29 denote NOR logic circuits, and numeral 30 denotes an inverter circuit 30. The output signal c of the voltage comparing circuit 22 and the lowest-bit row address signal $A_0$ are supplied to the NOR logic circuit 27. The output signal b of the voltage comparing circuit 21 is supplied to the NOR logic circuit 28 via the inverter circuit 30, and the row address signal $/A_0$ is also supplied to the NOR logic circuit 28. Output signals from the NOR logic circuits 27 and 28 as well as the output signal a of the voltage comparing circuit 20 are supplied to the NOR logic circuit 29.

An output buffer circuit (BC) 31 detects the output signal from the NOR logic circuit 29 and outputs "1"-level data or "0"-level data. A chip selection signal CS controls output of data from the output buffer circuit 31.

All the transistors are N-channel transistors, like those shown in FIG. 27.

The operation of the circuit with the above structure will now be described. When row address signals are input to the row decoder 4, the row decoder 4 selects one of the row lines 5 and sets it at "1" level. When column address signals are input to the column decoder 1, the column decoder 1 selects and activates one of the column selection transistors 2. The memory cell transistor 6 located at the intersection of the selected column line 3 and row line 5 is driven, and this column line 3 is charged or discharged through the memory cell transistor 6. If the threshold voltage of the transistor 6 is Vth4, the potential of the column line 3 is $V_1$ at the time the column line 3 has been discharged. The potential $V_1$ of the column line 3 is compared with voltages $V_1$, $V_2$ and $V_3$ in the voltage comparing circuits 20, 21 and 22. As a result, all signals a, b and c are set at "1" level. At this time, since the "1" level signal a is input to the NOR logic circuit 29, the output of the NOR logic circuit 29 is "0" level, irrespective of the output signals of the NOR logic circuits 27 and 28. If the output buffer circuit 31 is activated by the chip selection signal CS, the "0" level signal is output as data stored in the selected memory cell transistor 6 from the output buffer circuit 31. In other words, whether the address signal $A_0$ is at "0" level or "1" level, the output signal of the NOR logic circuit 29 is at "0" level and a "0" level signal is output from the output buffer circuit 31.

Thus, data D0 and D1 (D0=D1="0") of two bits, as shown in FIG. 28, are output from one memory cell.

If the threshold voltage of the memory cell transistor 6 located at the intersection of the selected column line 3 and row line 5 is Vth3, the potential of the column line 3 is $V_2$ at the time the column line 3 has been discharged by the memory cell transistor 6. In this case, only the output signal a of the voltage comparing circuit 20 is at "0" level, and the output signals b and c of the other two voltage comparing circuits 21 and 22 are at "1" level. If the row address signal $A_0$="1" and the row address signal /$A_0$="0", the output signal of the NOR logic circuit 28 is "1" level since the output signal of the inverter circuit 30 is "0" level. The output signal of the NOR logic circuit 29 is "0" level. Accordingly, the "0" level signal is output from the output buffer circuit 31.

On the other hand, if the row address signal $A_0$="0" and the row address signal /$A_0$="1", the output signals of both NOR logic circuits 27 and 28 are "0" level. Since the signal a is also "0" level, the output signal of the NOR logic circuit 29 is "1" level. Accordingly, the "1" level signal is output from the output buffer circuit 31.

In this case, data D0 and D1 (D0="0", D1="1") of two bits, as shown in FIG. 28, are output from one memory cell in accordance with the "1" level and "0" level of the address signal $A_0$.

If the threshold voltages of the memory cell transistors is Vth2 or Vth1, the potentials of the column line 3 are $V_3$ and $V_4$, respectively, at the time the charge or discharge of the column line 3 has been completed. When the potential of the column line reaches $V_3$, the output signals a and b of both voltage comparing circuits 20 and 21 are "0" level and the output signal c of the voltage comparing circuit 22 is "1" level. In this case, the output signal of the NOR logic circuit 29 is "1" level, whether the row address signal $A_0$="1" and the row address signal /$A_0$="0", or the row address signal $A_0$="0" and the row address signal /$A_0$="1", because all input signals of this NOR logic circuit 29 are "0" level. Thus, data D0 and D1 (D0=D1="1") of two bits, as shown in FIG. 28, are output from one memory cell.

On the other hand, when the potential of column line 3 reaches $V_4$, data D0 and D1 (D0="1", D1="0") of two bits, as shown in FIG. 28, are output from one memory cell. Specifically, when all the signals a, b and c are "0" level and when the address signal $A_0$="1" and the address signal /$A_0$="0", the output of the NOR logic circuit 27 is "0" level and the output of the inverter circuit 30 is "1" level. Accordingly, the output of the NOR logic circuit 28 is "0" level. Thus, all input signals to the NOR logic circuit 29 are "0" level, and the output of the NOR logic circuit 29 is "1" level.

Furthermore, if the address signal $A_0$="0" and the address signal /$A_0$="1", all inputs to the NOR logic circuit 27 ate "0" level. Thus, the output of the NOR logic circuit 27 is "1" level. Since one of the inputs to the NOR logic circuit 29 is "1" level, the output from the NOR logic circuit 29 is "0" level. Accordingly, when the address signal $A_0$="1", the "1" level signal is output as the stored data of the selected memory cell from the output buffer circuit 31. When the address signal $A_0$="0", the "0" level signal is output as the data from the output buffer circuit 31. In other words, if the column line potential is $V_4$, data D0 and D1 (D0="1", D1="0") of two bits, as shown in FIG. 28, are output from one memory cell.

With the above circuit, two-bit data of two addresses is stored in one memory cell. Thus, double data can be stored in the memory cell without increasing the chip size. In other words, the chip size can be remarkably reduced, with the same memory capacity as in the prior art.

In the above circuit, the potential of the column line 3 at the time of completion of charge or discharge is determined by presetting the threshold voltage of the memory cell transistor 6 at one of four threshold voltages. The potential of the column line 3 at the time of completion of charge or discharge can be determined by providing four kinds of channel widths W1, W2, W3, W4 of the transistors 6, as shown in FIG. 30, or by providing four kinds of channel lengths L1, L2, L3, L4, as shown in FIG. 31, instead of the four kinds of threshold voltages Vth1, Vth2, Vth3 and Vth4. When the potentials of the column lines 3 are determined by the channel widths of the transistors 6, if the channel widths have the relationship of W4<W3<W2<W1, the potentials of the column lines 3 at the time of completion of charge or discharge, i.e. the potentials Vp at the node P, have the relationship of Vp1<Vp2<Vp3<Vp4. The potentials Vp1 to Vp4 are equal to the potentials of the column lines charged or discharged by the transistors of channel widths W1 to W4, respectively. When the potentials of the column lines 3 are determined by the channel lengths of the transistors 6, if the channel lengths have the relationship of L1<L2<L3<L4, the potentials Vp at the time of completion of charge or discharge have the relationship of Vp1<Vp2<Vp3<Vp4. The potentials Vp1 to Vp4 are equal to the potentials of the column lines charged or discharged by the transistors of channel lengths L1 to L4, respectively. When the potentials of the column lines 3 are to be set by the channel widths or channel lengths of the transistors 6, the channel widths of the transistors 15, 18 and 19 of the potential generating circuits 12, 13 and 14 need to be set at W1, W2 and W3, respectively, or the channel lengths thereof need to be set at L1, L2 and L3, respectively. In each case, the memory size can be reduced, compared to the prior art. In the case of setting the potentials of the column lines 3 at the time of completion of charge or discharge at four levels by the threshold voltages of the transistors 6, the memory cell size can be reduced to a minimum. On the other hand, at least three manufacturing steps need to be additionally provided, as compared to the prior art, at the time of setting four threshold voltages, i.e. at the time of writing data. However, if the data of the memory cell is determined by providing four channel widths or four channel lengths of the transistors 6, the increase in number of manufacturing steps can be prevented.

In the case of storing data by varying the channel width of the transistor, the number of manufacturing steps does not increase. However, since the step of setting the channel width is performed at the early stage of manufacture, a long period of time of manufacture is required from the reception of a client's order to the delivery of a finished product. In the case of varying the channel length, data is stored at the time of forming gate electrodes. Thus, the time of manufacture is less than in the case of varying the channel width, but is greater than in the case of storing data by varying the threshold voltage.

Specifically, in the case of storing data by varying the threshold voltage, impurities for determining the threshold voltage of the memory cell are introduced by ion implantation in the channel region through the gate electrode after the gate electrode of the memory cell is formed. Accordingly, the time of manufacture is made less than in the case of varying the channel width or channel length. However, since data is stored by varying the threshold voltage, a plurality of masks need to be used. In addition, ion implantation with different dosages must be performed with different masks according to data to be stored, and thus the number of manufacturing steps increases.

SUMMARY OF THE INVENTION

The object of the present invention is to provide a semiconductor memory device wherein an increase in manufacturing steps can be prevented, a time period for delivery can be decreased, data of plural bits can be stored in one memory cell, and stored data of plural bits can be read out exactly.

This object can be achieved by the following structures.

Specifically, in the present invention, data of plural bits is stored in one memory cell by varying an impurity-introducing area of a channel region, in which impurities are introduced through a gate electrode, in accordance with data to be stored. The impurity-introducing region is, for example, a region extending from a drain region to a source region with a predetermined width in the channel width direction, or a region extending over the entire channel width and having a predetermined length in the channel length direction. The impurity-introducing area is set in one of four states, thereby storing two-bit binary data.

Each memory cell has one of four threshold voltages. When two-bit data is read out from a memory cell, this memory cell is selected and first to fourth dummy cells having four threshold voltages are selected. The potential of the column line connected to the memory cell is compared with the potential of first to fourth dummy lines connected to the first to fourth dummy cells by first to third data sense circuits. Data signals output from the first to third data sense circuits are encoded by a logic circuit and two-bit data is read out.

The first dummy column line connected to the first dummy cells having a first threshold voltage, which is the highest of the four threshold voltages, is connected to the second dummy column line connected to the second dummy cells having a second threshold voltage, which is the second highest of the four threshold voltages. The third dummy column line connected to the third dummy cells having the second threshold voltage is connected to the fourth dummy column line connected to the fourth dummy cells having a third threshold voltage, which is the third highest of the four threshold voltages. The fifth dummy column line connected to the fifth dummy cells having the third threshold voltage is connected to the sixth dummy column line connected to the sixth dummy cells having a fourth threshold voltage, which is the lowest of the four threshold voltages. Thereby, three comparative voltages having intermediate values among the four threshold voltages can be easily produced. The three comparative voltages are compared with the potential of the column line connected to the memory cell by the first to third data sense circuits. The data output from the first to third data sense circuits is encoded by the logic circuit, thereby reading out two-bit data.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 1A and 1B show a first embodiment of a memory cell according to the present invention, in which FIG. 1A is a plan view and FIG. 1B is a cross-sectional view taken along line 1B—1B in FIG. 1A;

FIGS. 2A and 2B illustrate a step of writing data in the memory cell shown in FIGS. 1A and 1B, in which FIG. 2A is a plan view and FIG. 2B is a cross-sectional view taken along line 2B—2B in FIG. 2A;

FIGS. 3A and 3B illustrate a step of writing data in the memory cell shown in FIGS. 1A and 1B, in which FIG. 3A is a plan view and FIG. 3B is a cross-sectional view taken along line 3B—3B in FIG. 3A;

FIGS. 4A and 4B illustrate a step of writing data in the memory cell shown in FIGS. 1A and 1B, in which FIG. 4A is a plan view and FIG. 4B is a cross-sectional view taken along line 4B—4B in FIG. 4A;

FIG. 5A and 5B illustrate a step of writing data in the memory cell shown in FIGS. 1A and 1B, in which FIG. 5A is a plan view and FIG. 5B is a cross-sectional view taken along line 5B—5B in FIG. 5A;

FIGS. 6A and 6B show a second embodiment of the memory cell according to the present invention, in which FIG. 6A is a plan view and FIG. 6B is a cross-sectional view taken along line 6B—6B in FIG. 6A;

FIGS. 7A and 7B illustrate a step of writing data in the memory cell shown in FIGS. 6A and 6B, in which FIG. 7A is a plan view and FIG. 7B is a cross-sectional view taken along line 7B—7B in FIG. 7A;

FIGS. 8A and 8B illustrate a step of writing data in the memory cell shown in FIGS. 6A and 6B, in which FIG. 8A is a plan view and FIG. 8B is a cross-sectional view taken along line 8B—8B in FIG. 8A;

FIGS. 9A and 9B illustrate a step of writing data in the memory cell shown in FIGS. 6A and 6B, in which FIG. 9A is a plan view and FIG. 9B is a cross-sectional view taken along line 9B—9B in FIG. 9A;

FIGS. 10A and 10B illustrate a step of writing data in the memory cell shown in FIGS. 6A and 6B, in which FIG. 10A is a plan view and FIG. 10B is a cross-sectional view taken along line 10B—10B in FIG. 10A;

FIGS. 11A and 11B show a third embodiment of the memory cell according to the present invention, in which FIG. 11A is a plan view and FIG. 11B is a cross-sectional view taken along line 11B—11B in FIG. 11A;

FIGS. 12A and 12B illustrate a step of writing data in the memory cell shown in FIGS. 11A and 11B, in which FIG. 12A is a plan view and FIG. 12B is a cross-sectional view taken along line 12B—12B in FIG. 12A;

FIGS. 13A and 13B illustrate a step of writing data in the memory cell shown in FIGS. 11A and 11B, in which FIG. 13A is a plan view and FIG. 13B is a cross-sectional view taken along line 13B—13B in FIG. 13A;

FIGS. 14A and 14B illustrate a step of writing data in the memory cell shown in FIGS. 11A and 11B, in which FIG. 14A is a plan view and FIG. 14B is a cross-sectional view taken along line 14B—14B in FIG. 14A;

FIGS. 15A and 15B illustrate a step of writing data in the memory cell shown in FIGS. 11A and 11B, in which FIG. 15A is a plan view and FIG. 15B is a cross-sectional view taken along line 15B—15B in FIG. 15A;

FIG. 17 shows another part of the first embodiment of the data read-out circuit as shown in FIG. 16;

FIGS. 18A, 18B and 18C are circuit diagrams showing the structure of a sense amplifier as shown in FIG. 17;

FIG. 19 is a table for illustrating the operation of the read-out circuit as shown in FIGS. 16 and 17;

FIG. 21 shows another part of the second embodiment of the data read-out circuit as shown in FIG. 21;

FIGS. 22A and 22B are circuit diagrams showing the structure of a load circuit as shown in FIG. 21;

FIG. 23 shows a part of a third embodiment of the data read-out circuit applied to the memory cell of the present invention;

DETAILED DESCRIPTION OF THE PREFERRED EMBODIMENTS

Preferred embodiments of the present invention will now be described with reference to the accompanying drawings.

Figure 1A:
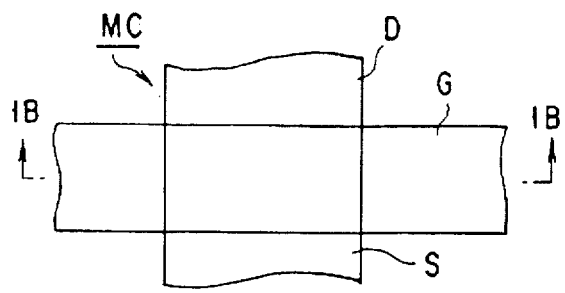
Figure 1B:
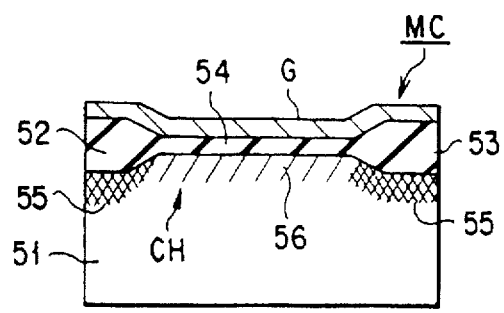

FIGS. 1A and 1B show a first embodiment of a memory cell of the present invention and illustrate a method of writing data in the memory cell. In FIG. 1A, symbol G denotes a gate, S a source, and D a drain. FIG. 1B shows the state of the memory cell prior to data write. Field insulating films 52 and 53 are formed in a surface region of a substrate 51. A gate insulating film 54 is formed between the field insulating films 52 and 53. The gate G is formed on the field insulating films 52 and 53 and gate insulating film 54. Impurities 55 are introduced into the substrate 51 below the field insulating films 52 and 53. Impurities 56 are introduced into a channel region CH within the substrate 51 to set a predetermined threshold voltage.

For example, when the memory cell is constituted by an N-channel transistor, the threshold voltage of the memory cell may be determined by making use of ion implantation which is performed in a channel region of a peripheral N-channel enhancement transistor to set the threshold voltage of this peripheral transistor. In the present invention, after the gate electrode of the memory cell is formed, impurities are introduced by the ion implantation into the channel region of the memory cell through the gate electrode thereof. The substantial channel width is varied by the introduction of the impurities. Thus, only a manufacturing step of introducing impurities is added, and the delivery date can be made earlier.

In the present invention, data of two bits are stored by four states shown in FIGS. 2A to 5B. Specifically, glass masks with different opening areas are used to control the location and amount of impurities to be introduced into the channel region of the memory cell.

Figure 2A:
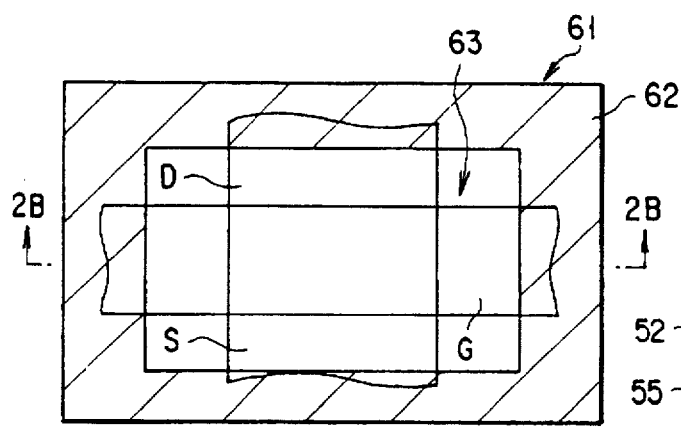
Figure 2B:
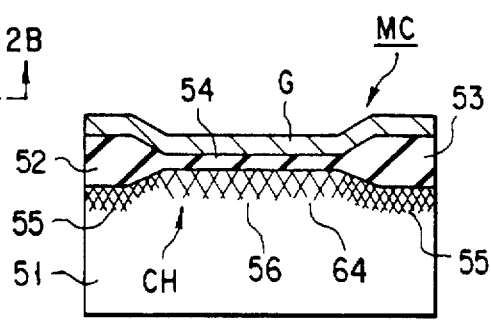

In FIG. 2A, numeral 61 denotes a mask. In the mask 61, a resist 62 is coated on a chip. An opening 63 is an area where the resist is exposed through a glass mask (not shown) and removed. The opening 63 has an area corresponding to the entire channel region CH. Using the mask 61, impurities are introduced into the channel region CH. FIG. 2B is a cross-sectional view taken along line 2B—2B in FIG. 2A, and shows the state in which impurities 64 are introduced into the entire channel region CH. The amount of introduced impurities is suitably controlled to set the threshold voltage of the memory cell so that the memory cell may not be turned on when it is selected. It may be considered that this memory cell has a channel width of zero, i.e. this memory cell has no channel.

Figure 3A:
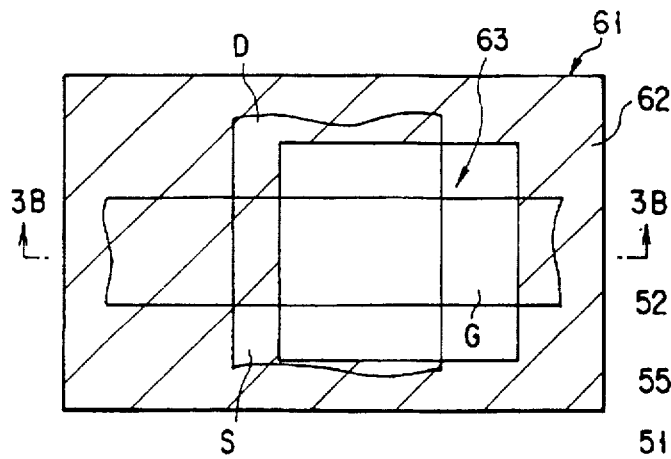
Figure 3B:
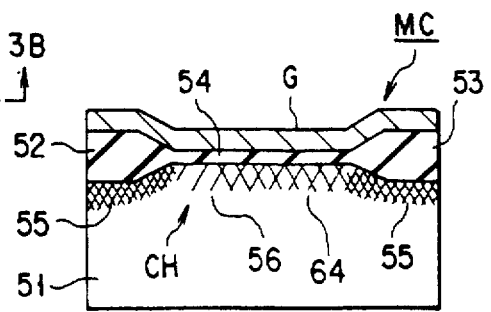
Figures 4A, 4B:
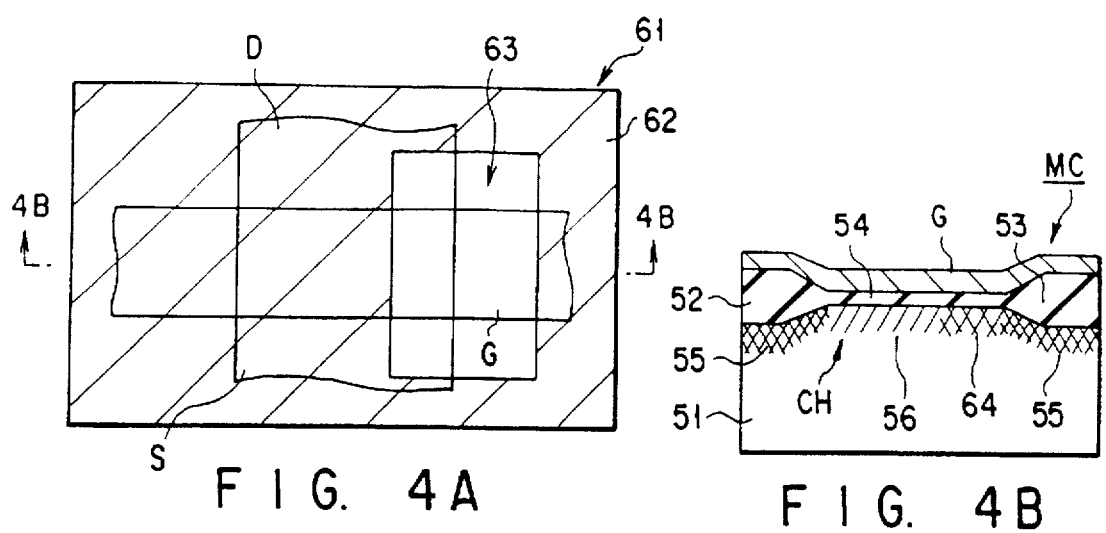

In FIG. 3A, a part of the channel region CH is covered with the resist 62 so that the impurities may not be introduced into the part of the channel region CH. In FIG. 4A, too, a part of the channel region CH is covered with the resist 62 so that the impurities may not be introduced into the part of the channel region CH. In the structure of FIG. 4A, however, the width of the channel region covered with the resist 62 is greater than in the structure shown in FIG. 3A. Thus, the substantial channel width in FIG. 4A is greater than that in FIG. 3A. A larger current flows through the memory cell shown in FIGS. 4A and 4B, when selected, than through the memory cell shown in FIGS. 3A and 3B.

Figures 5A, 5B:
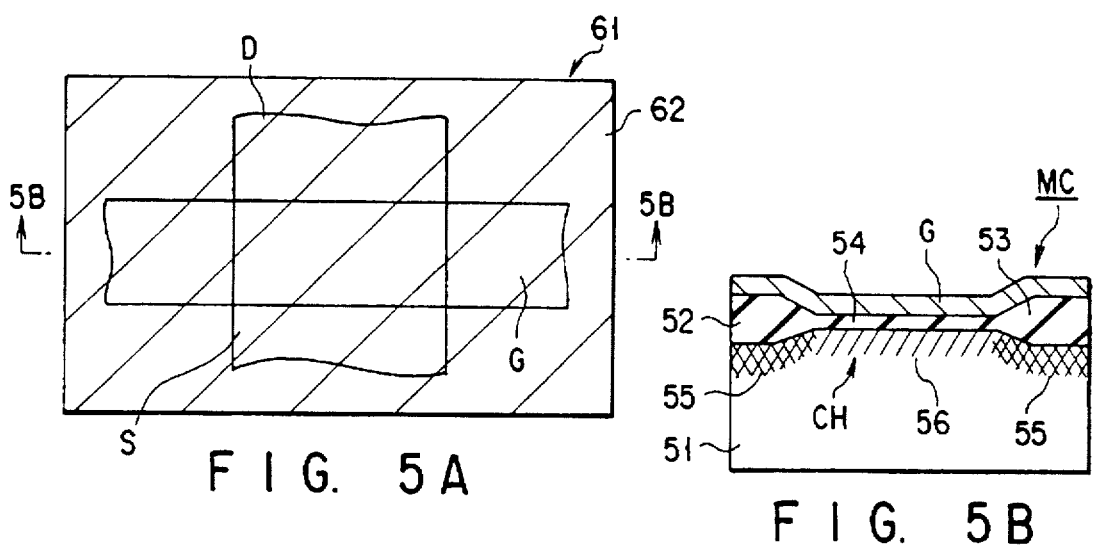

In FIG. 5A, the entire surface of the memory cell is covered with the resist 62 so that the impurities 64 may not be introduced into the channel region CH of the memory cell. Thus, the threshold voltage of the memory cell of FIGS. 5A and 5B remains at an initially set value and therefore the largest current can flow through the memory cell when it is selected. In this embodiment, the substantial channel widths have the relationship of FIG. 2A<FIG. 3A<FIG. 4A<FIG. 5A.

As has been described above in connection with the prior art, it should suffice if electric currents of four different levels flow through the selected memory cells of this type. Accordingly, the memory cell with the entire channel region doped with the impurities 64, as shown in FIG. 2A, may remain turned on, when it is selected. However, if this memory cell is so designed as to be turned off when selected, the differences in current value among the other memory cells can be increased. Thus, margins in current value can be advantageously increased at the time of data read-out.

In the above embodiment, the threshold voltage of the memory cell is low in the early stage of manufacture. After the gate electrode is formed, the threshold voltage is increased by ion implantation at the time of data write. It is possible, however, to set the threshold voltage of the memory cell at a maximum value in the early stage of manufacture. In this case, the threshold value is decreased by introducing impurities after the gate electrode is formed. In order to increase the threshold voltage of the memory cell by ion implantation, boron, for example, may be introduced as impurities. In order to decrease the threshold value of the memory cell, phosphorus or arsenic, for example, may be introduced.

According to the above embodiment, data is written after the gate electrode is formed. Thus, the memory cell may be semifinished up to the stage immediately prior to data write. Therefore, the time period from the reception of a client's order to the delivery of the finished product can be decreased. Furthermore, data is written in the memory cell only by introducing impurities into the channel region with use of a single glass mask having the opening 63 of a different area. Thus, this embodiment is advantageous in that only one manufacturing step is added.

FIGS. 6A to 9B show a second embodiment of the memory cell of the invention. The structural elements common to those in the first embodiment shown in FIGS. 1A to 5B are denoted by like reference numerals. In the first embodiment, the substantial channel width of the transistor constituting the memory cell is varied. By contrast, in the second embodiment, the threshold voltage is varied to change the substantial channel length.

Figures 6A, 6B:
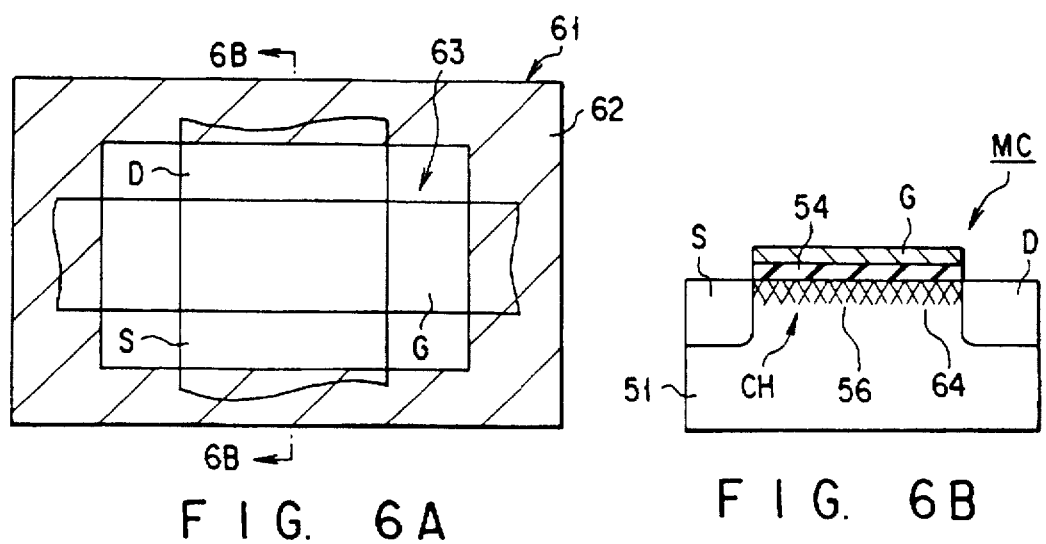

In the second embodiment, data of two bits are stored in four states shown in FIGS. 6A to 9B. In FIG. 6A, the mask 61 is provided with an opening 63 having an area corresponding to the entire channel region CH. Using the mask 61, impurities are introduced into the entire channel region CH through the gate G. FIG. 6B is a cross-sectional view taken along line 6B-6B in FIG. 6A. Impurities 64 are introduced into the entire channel region CH. In the case of this embodiment, the amount of impurities must be determined so as to set a threshold voltage at which the memory cell, when selected, is turned on.

Figure 7A:
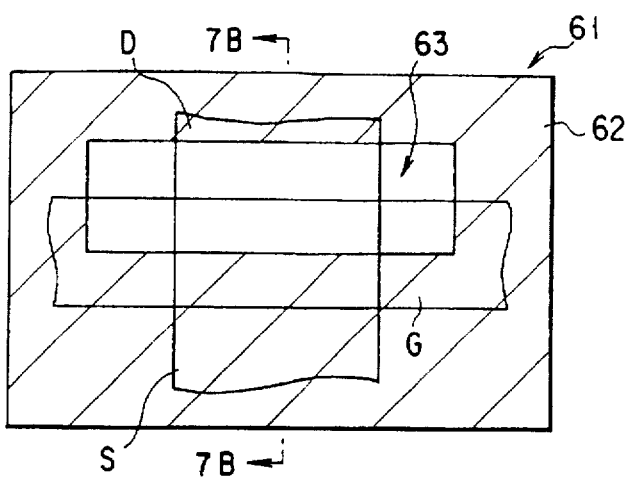
Figure 7B:
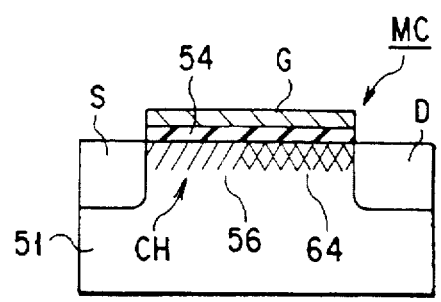

In FIG. 7A, a source (S)-side portion of the channel region is covered with the resist 62, thereby preventing impurities from being introduced into the source (S)-side portion of the channel region. If the amount of the impurities 64 is determined so that the memory cell shown in FIG. 6A, when selected, is not turned on, the memory cell is also not turned on in the case shown in FIGS. 7A and 7B. Consequently, data cannot be read out exactly.

Figure 8A:
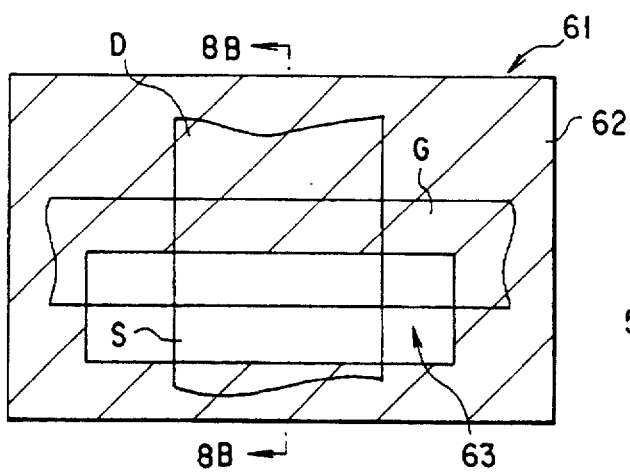
Figure 8B:
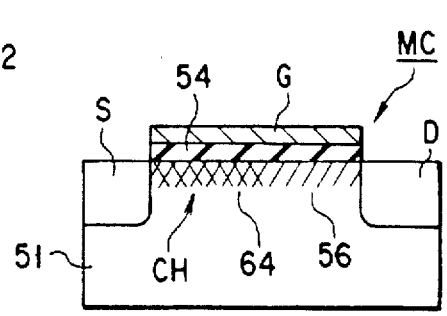

In FIG. 8A, a drain (D)-side portion of the channel region CH is covered with the resist, thereby preventing impurities from being introduced into the drain-side portion of the channel region. In the case of FIG. 7A, the source-side portion is covered with the resist to introduce impurities into the drain-side portion. Thus, the threshold voltage in the case of FIG. 7A is higher is than that in the case of FIG. 8A, owing to a difference in body effect of the MOS transistor. Accordingly, the substantial channel length is greater in FIG. 7A than in FIG. 8A. Therefore, a greater current flows in the memory cell shown in FIG. 8A than in the memory cell shown in FIG. 7A, when these cells are selected. Of course, as in the first embodiment, the region covered with the resist shown in FIG. 7A may be extended toward the drain in FIG. 8A, thereby changing the substantial channel length.

Figure 9A:
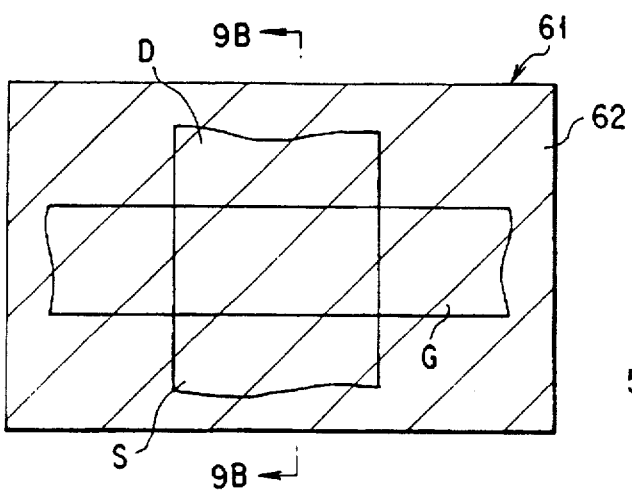
Figure 9B:
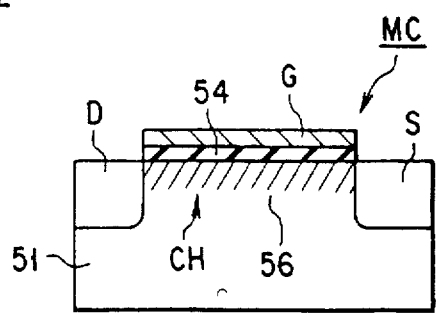

In FIG. 9A, the entire surface of the memory cell is covered with the resist 62, thereby preventing impurities 64 from being introduced into the channel region CH of the memory cell MC. Thus, the threshold voltage of the memory cell shown in FIGS. 9A and 9B remains at an initially set value, and the largest current can flow through the memory cell which is selected. Specifically, in this embodiment, the threshold voltages have the relationship, FIG. 6A>FIG. 7A>FIG. 8A>FIG. 9A. Thus, the substantial channel lengths have the relationship, FIG. 6A>FIG. 7A>FIG. 8A>FIG. 9A.

It is desirable that the memory cell having the entire channel region CH doped with the impurities 64, as shown in FIG. 6B, is turned off when selected. In this case, the difference in value of a current flowing through the other three kinds of memory cells can be increased, and a data read-out margin can be advantageously increased. Accordingly, only the memory cell having the entire channel region doped with impurities may be designed to be turned off when selected, by preparing and using another glass mask as shown in FIG. 10A and FIG. 10B for introducing the impurities.

In each case, the threshold voltage of the memory cell is low in the early stage of manufacture. After the gate electrode is formed, the threshold voltage is increased by ion implantation at the time of data write. It is possible, however, to set the threshold voltage of the memory cell at a maximum value in the early stage of manufacture. In this case, the threshold value is decreased by introducing impurities after the gate electrode is formed.

According to the memory cell of the second embodiment, four threshold voltages can be distinguished. Thus, it is possible to detect which one of the four kinds of memory cells is selected by measuring a source voltage of each memory cell having a drain connected to a power supply. Since the threshold voltages of the memory cells have the relationship, FIG. 6A>FIG. 7A>FIG. 8A>FIG. 9A, the source voltages of the memory cells have the relationship, FIG. 6A<FIG. 7A<FIG. 8A<FIG. 9A.

FIGS. 11A to 15B show a third embodiment of the invention. The structural elements common to those in the first and second embodiments are denoted by like reference numerals. The memory cell employed in the third embodiment comprises two transistors, and the threshold voltages of the two transistors of each memory cell are set according to data.

In FIG. 11B, a gate insulating film 54 includes first region 54a and second region 54b in the direction of channel width. The thickness of the first region 54a is less than that of the second region 54b. A gate G is formed on the gate insulating film 54. Accordingly, the memory cell MC includes first transistor T1 and second transistor T2 having gate insulating films of different thicknesses in accordance with the first region 54a and second region 54b, respectively.

In FIG. 12A, the mask 61 with an opening 63 having an area corresponding to the entire channel region CH is used to introduce impurities into the entire channel region CH through the gate G. FIG. 12B is a cross-sectional view taken along line 12B—12B in FIG. 12A. Impurities 64 are introduced into the entire channel region CH. The amount of impurities 64 is determined so that both first transistor T1 and the second transistor T2 are turned off when this memory cell is selected.

Figures 13A, 13B:
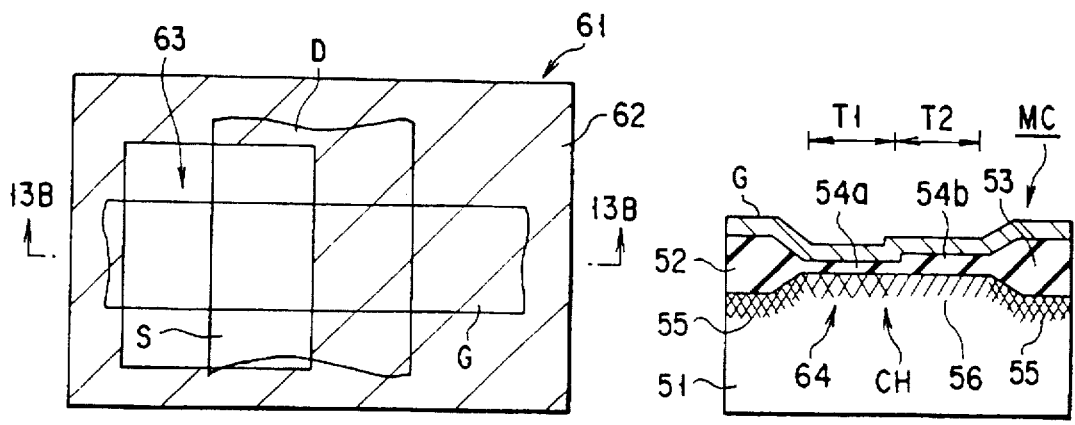

In FIGS. 13A and 13B, the channel region CH of the second transistor T2 is covered with the resist 62, thereby preventing impurities 64 from being introduced into the channel region CH of the second transistor T2. The threshold voltage of the first transistor T1 doped with the impurities 64 is higher than that of the second transistor T2. When the memory cell MC is selected, the first transistor T1 is turned off and the second transistor T2 is turned on.

Figures 14A, 14B:
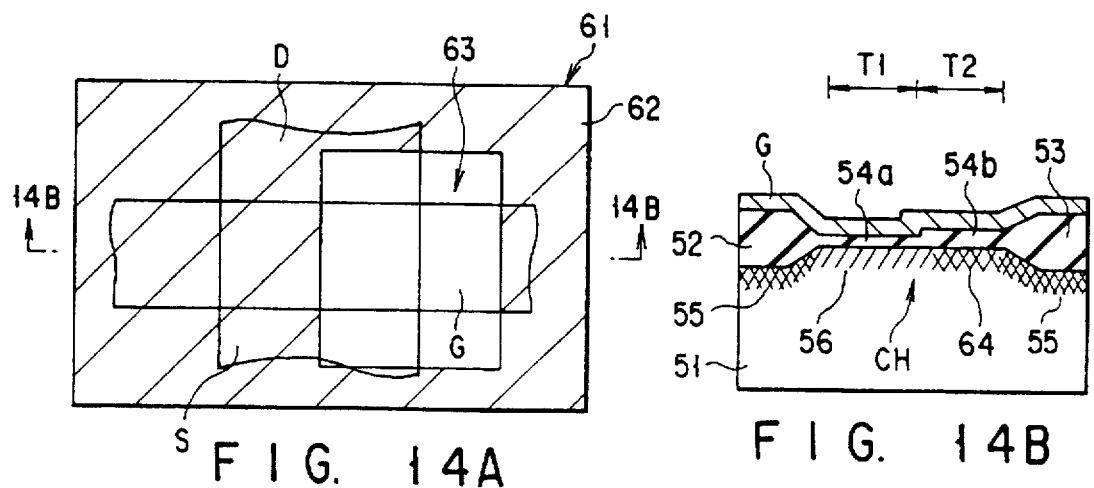

In FIG. 14A, the channel region CH of the first transistor T1 is covered with the resist 62, thereby preventing impurities 64 from being introduced into the channel region of the first transistor T1. Thus, the threshold voltage of the second transistor T2 doped with the impurities 64 is higher than that of the first transistor T1. When the memory cell is selected, the first transistor T1 is turned on and the second transistor T2 is turned off. In the case of the structure shown in FIG. 14B, the substantial channel width is greater than that in the structure shown in FIG. 13B. A greater current flows through the memory cell shown in FIG. 14B than through the memory cell shown in FIG. 13B, when these cells are selected. The reason for this is that the gate insulating film of the transistor Ti is less than that of the transistor T2 and therefore the threshold voltage of the transistor T1 is lower than that of the transistor T2 if the amount of impurities in the channel region CH is the same. Thus, if the transistors T1 and T2 are equal in channel length and channel width, a greater current flows through the memory cell shown in FIG. 14B than through the memory cell shown in FIG. 13B.

Figures 15A, 15B:
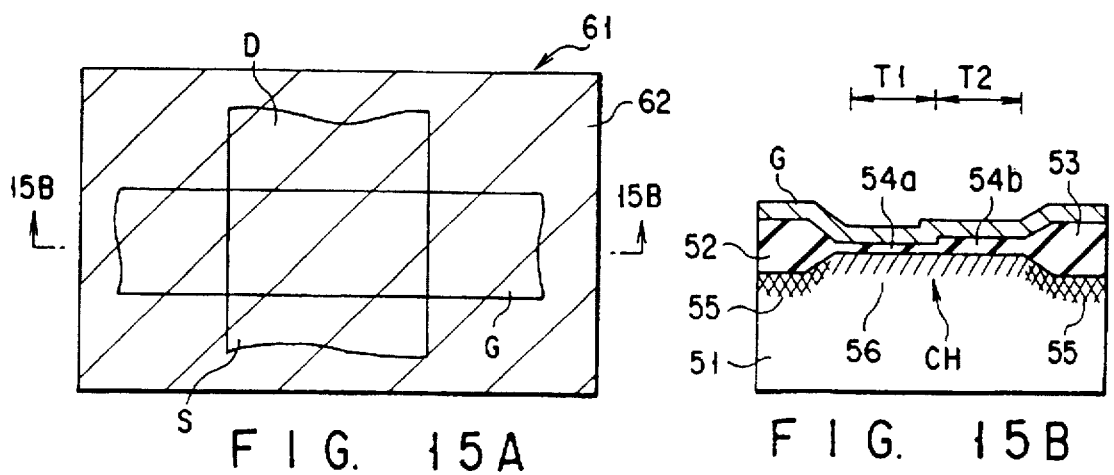

In FIG. 15A, the entire surface of the memory cell is covered with the resist 62 to prevent impurities 64 from being introduced into the channel regions of the first transistor T1 and the second transistor T2. Since the threshold voltage of the memory cell remains at an initially set value, both the first transistor T1 and the second transistor T2 are turned on when the memory cell is selected and the greatest current can flow through the memory cell. Specifically, in this embodiment, the amounts of currents flowing through the selected memory cells have the relationship, FIG. 12A<FIG. 13A<FIG. 14A<FIG. 15A.

The above description is directed to the case where data of two bits are stored in one memory cell. However, data of three bits or data of four bits may be stored in one memory cell. For example, when data of three bits are stored, the memory cell is designed to have one of eight channel widths.

Figures 27, 28:
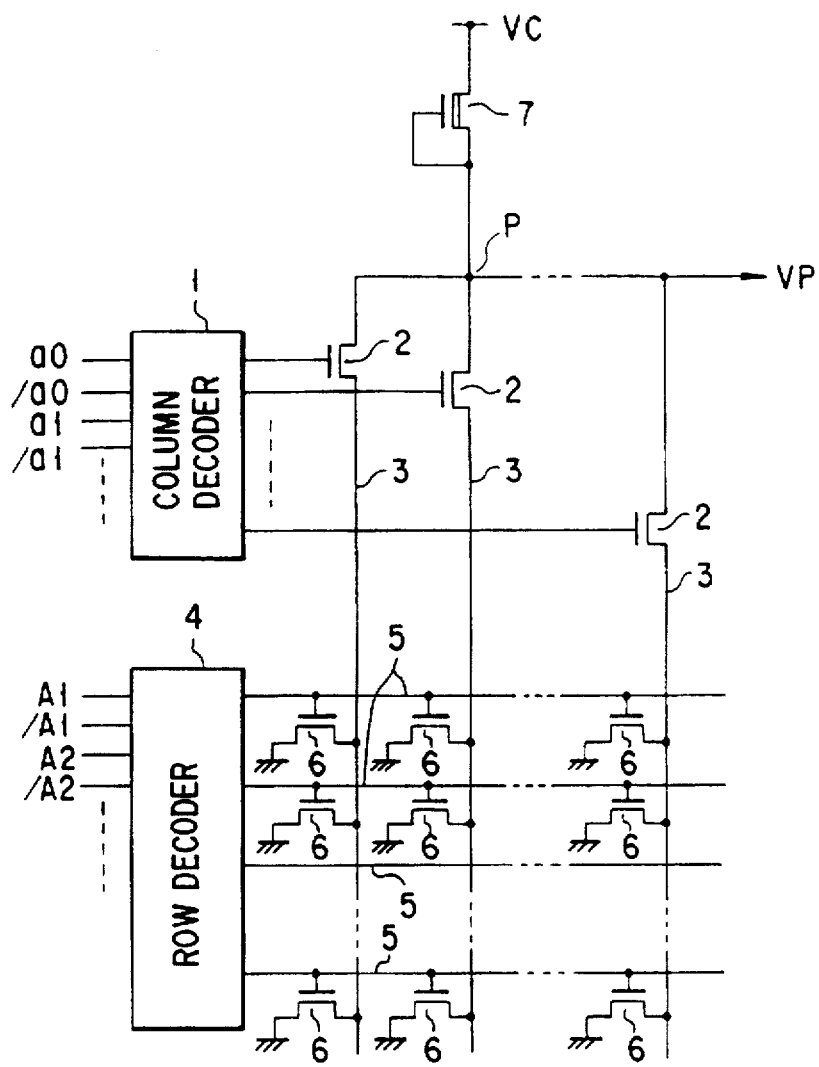
FIG. 27 shows a part of a data read-out circuit applied to a conventional memory cell.
FIG. 28 shows a relationship between data stored in the conventional memory cell and threshold voltages.
Figure 29:
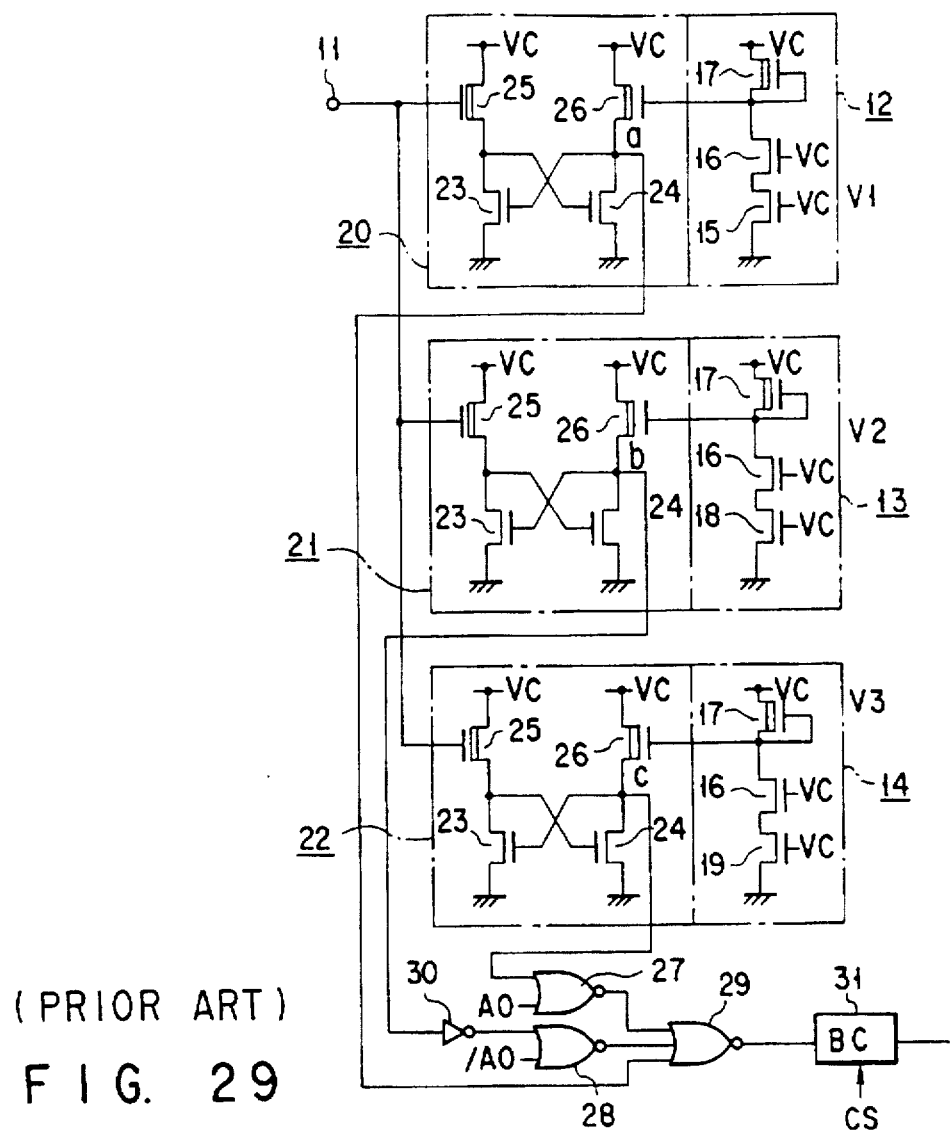
FIG. 29 shows another part of the data read-out circuit as shown in FIG. 27.
Figure 30:
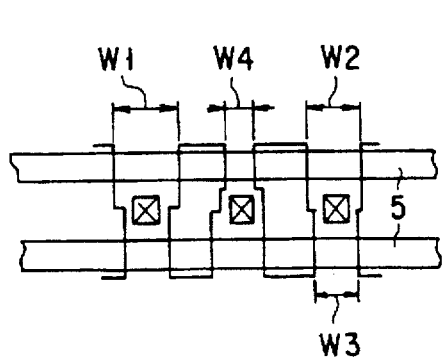
FIG. 30 is a plan view showing an example of the conventional memory cell.
Figure 31:
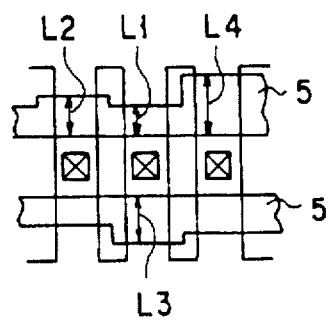
FIG. 31 is a plan view showing another example of the conventional memory cell.

Next, preferred embodiments of a circuit for reading out data of plural bits stored in the above-described memory cell will now be described. Needless to say, the data may be read out from the memory cell by using the conventional data detection circuit as described with reference to FIGS. 27, 28 and 29.

Figure 16:
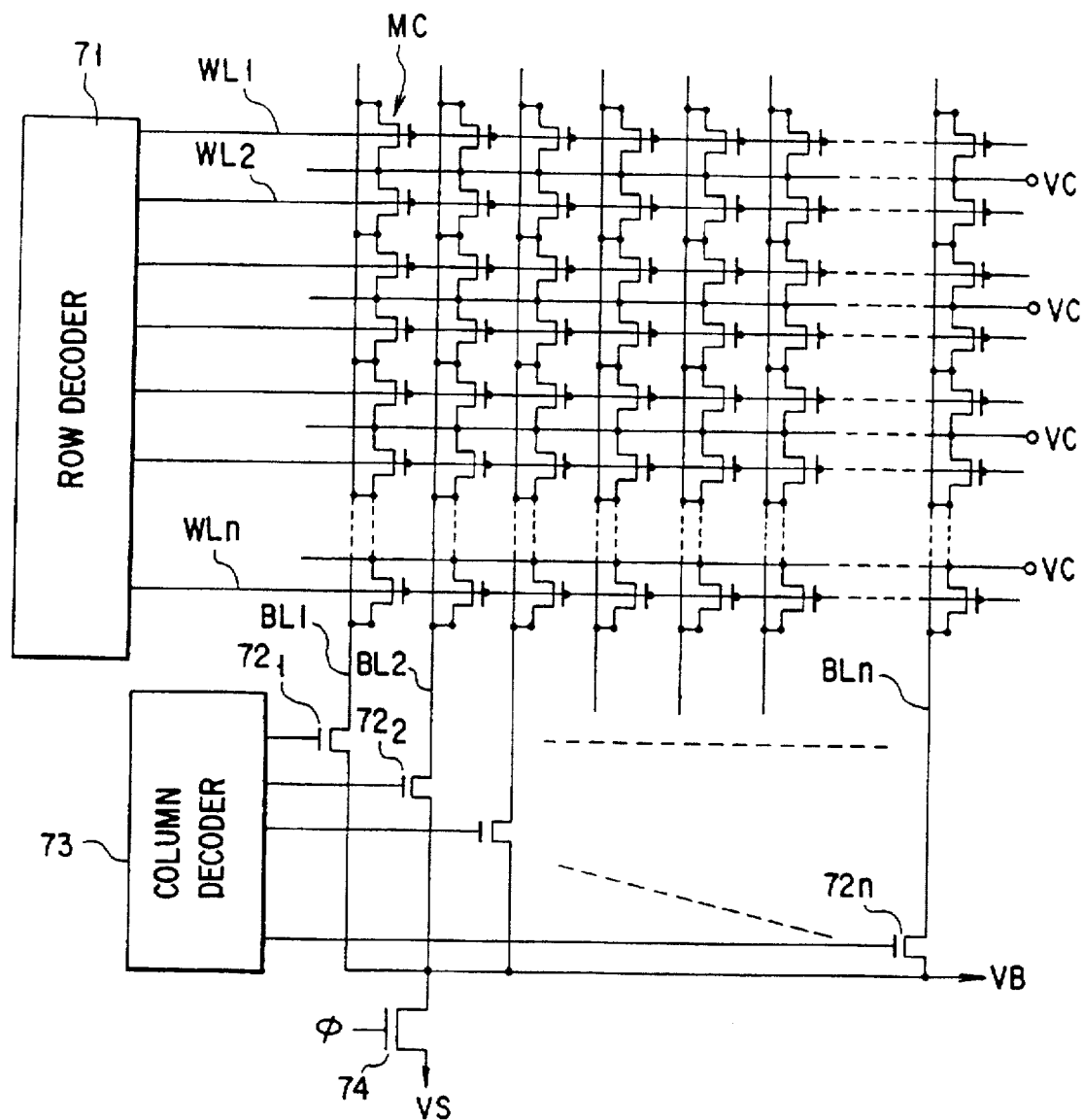
FIG. 16 shows a part of a first embodiment of a data read-out circuit applied to the memory cell of the present invention.

FIGS. 16 and 17 show a first embodiment of a read-out circuit for reading out data from the memory cells shown in FIGS. 6A to 10B. The circuit shown in FIGS. 16 and 17 is also applicable to the case of reading out data from a memory cell the threshold of which is set by a conventional method.

In FIG. 16, a plurality of memory cells MC are constituted by N-channel transistors and arranged in a matrix form. The gates of the memory cells MC are connected to row lines (hereinafter referred to as "word lines") WL1, WL2 ... WLn, the sources thereof are connected to column lines ("bit lines") BL1, BL2 ... BLn, and the drains thereof are supplied with a power supply voltage VC of, e.g. 5 V. The word lines WL1, WL2 ... WLn are connected to a row decoder 71. The row decoder 71 selects one of the word lines in accordance with an address signal (not shown). The bit lines BL1, BL2 ... BLn are connected to the drains of N-channel transistors $72_1, 72_2 \ldots 72_n$, respectively. The gates of the N-channel transistors $72_1, 72_2 \ldots 72_n$ are connected to a column decoder 73. The column decoder 73 selects one of the transistors $72_1, 72_2 \ldots 72_n$ in accordance with an address signal. The selected transistor selects one of the bit lines. The sources of the transistors $72_1, 72_2 \ldots 72_n$ are connected to the drain of an N-channel transistor 74. The source of the N-channel transistor 74 is connected to a reference potential Vs, e.g., a ground potential, and the gate thereof is supplied with a signal φ. A bit line potential VB output from selected one of the transistors $72_1, 72_2 \ldots 72_n$ is delivered to sense amplifiers SA1, SA2 and SA3 as shown in FIG. 17. The sense amplifiers SA1, SA2 and SA3 have different threshold voltages, as will be described later. Making use of these different threshold voltages, the bit line potential VB is detected.

In FIG. 17, output signals S1, S2 and S3 are produced from output terminals of the sense amplifiers SA, SA2 and SA3, respectively. The output signals S1 to S3 are supplied to a logic circuit 86 comprising inverter circuits 80, 81 and 84 and NAND gate circuits 82, 83 and 85. The output signal S1 from the sense amplifier SA1 is delivered to the NAND circuits 82 and 83, and the output signal S2 from the sense amplifier SA2 is delivered to the inverter circuit 80 and NAND circuit 82. The output signal S3 from the sense amplifier SA3 is delivered to the inverter circuit 81. An output signal from the inverter circuit 80 is supplied to the NAND circuit 83, and an output signal from the NAND circuit 83 and an output signal from the inverter circuit 81 are supplied to the NAND circuit 85. An output signal from the NAND circuit 82 is supplied to the inverter circuit 84. Data of two bits of D1 and D2 stored in the selected memory cell are output from output terminals of the inverter circuit 84 and NAND circuit 85.

FIG. 18A shows the sense amplifier SA1. The sense amplifier SA1 comprises an N-channel enhancement type transistor 100 having a threshold voltage of, e.g., 0 V, a P-channel enhancement type transistor 101 serving as a load for the transistor 100, and an inverter circuit Ii. The transistors 101 and 100 are connected in series between a terminal supplied with a power supply voltage VC and a ground terminal having a reference potential Vs. An input terminal of the inverter circuit I1 is connected to a connection node between the transistors 100 and 101. The gate of the transistor 100 is supplied with the potential VB of the selected bit line, and the gate of the transistor 101 is grounded.

FIG. 18B shows the sense amplifier SA2. The sense amplifier SA2 comprises an N-channel enhancement type transistor 102 having a threshold voltage of, e.g., 2 V, a P-channel enhancement type transistor 103 serving as a load for the transistor 102, and an inverter circuit I2. The transistors 103 and 102 are connected in series between a terminal supplied with a power supply voltage VC and a ground terminal having a reference potential Vs. An input terminal of the inverter circuit I2 is connected to a connection node between the transistors 102 and 103. The gate of the transistor 102 is supplied with the potential VB of the selected bit line, and the gate of the transistor 103 is grounded.

FIG. 18C shows the sense amplifier SA3. The sense amplifier SA3 comprises an N-channel enhancement type transistor 104 having a threshold voltage of, e.g., 3.5 V, a P-channel enhancement type transistor 105 serving as a load for the transistor 104, and an inverter circuit I3. The transistors 105 and 104 are connected in series between a terminal supplied with a power supply voltage VC and a ground terminal having a reference potential Vs. An input terminal of the inverter circuit I3 is connected to a connection node between the transistors 104 and 105. The gate of the transistor 104 is supplied with the potential VB of the selected bit line, and the gate of the transistor 105 is grounded.

The operation of reading out data from the memory cells in the above structure will now be described.

When one of the word lines WL1, WL2 ... WL and one of the bit lines BL1, BL2 ... BLn have been selected, the signal φ is set at "1" level for a predetermined time period and the transistor 74 is turned on. The potential VB of the selected bit line is discharged to reference potential Vs. After a predetermined time period, the transistor 74 is turned off. Accordingly, the selected bit line is charged through the selected memory cell. The potential of the selected bit line is set at a value corresponding to the threshold voltage of the selected memory cell. In FIG. 16, the selected bit line is discharged through one of the transistors $72_1$, $72_2$ ... $72_n$ by one transistor 74. However, the discharging transistor 74 may be provided for each bit line. Besides, all word lines are set at 0 V or a reference potential before newly selecting one of the word lines. Thereby, the high read-out speed can be acheved.

One of the memory cells shown in FIG. 16 will now be considered. The drain of the memory cell MC is connected to the terminal supplied with power supply voltage VC of 5 V, the gate thereof is connected to the word line WL1, and the source thereof is connected to the bit line BL1. When the memory cell MC is not selected, the word line potential is 0 V and the memory cell is turned off. When the memory cell MC is selected, the power supply voltage VC is supplied from the row decoder 71 to the word line WL1. At this time, when no electric current flows from the source of the selected memory cell, i.e. bit line BL1, the potential of the bit line BL1 is equal to a value obtained by subtracting the threshold voltage of the memory cell MC from the gate voltage, i.e. power supply voltage VC. If there are four threshold voltages, Vth1, Vth2, Vth3 and Vth4, the potential of the bit line BL1 is one of VC minus Vth1, VC minus Vth2, VC minus Vth3 and VC minus Vth4 in accordance with the threshold voltage of the selected memory cell.

For the purpose of simplicity, suppose that each memory cell has one of four threshold voltages, 6 V, 3.5 V, 2 V and 0 V, as shown in FIG. 19. Further, as shown in FIG. 19, suppose that two-bit data (0, 0) corresponds to the threshold voltage 6 V of the memory cell, two-bit data (0, 1) corresponds to the threshold voltage 3.5 V of the memory cell, two-bit data (1, 0) corresponds to the threshold voltage 2 V of the memory cell, and two-bit data (1, 1) corresponds to the threshold voltage 0 V the memory cell. When the memory cell is selected, the gate potential of the selected memory cell is set at the power supply voltage VC (5 V). Thus, if no current output path is provided for the bit line BL, the potential of the bit line BL is, as shown in FIG. 19, set at 0 V when the threshold voltage of the selected memory cell is 6 V, set at 1.5 V when the threshold voltage of the selected memory cell is 3.5 V, set at 3 V when the threshold voltage of the selected memory cell is 2 V, and set at 5 V when the threshold voltage of the selected memory cell is 0 V. The bit line potential is detected to determine which threshold voltage the selected memory cell has. Thereby, stored two-bit data can be output. The bit line potential VB is sensed by the sense amplifiers SA1, SA2 and SA3.

Specifically, in the sense amplifier SA1 shown in FIG. 18A, the threshold voltage of the transistor 100 is set at 0 V. When the bit line potential VB is 0 V, the transistor 100 is turned off, and the junction between the transistors 100 and 101 is charged to VC by the transistor 101. Accordingly, the output signal Si of the inverter circuit Ii is at "0" level when the bit line potential VB is 1.5 V, the transistor 100 is turned on and the junction between the transistors 100 and 101 is discharged to the reference potential Vs by the transistor 100. In this case, the output signal Si of the inverter circuit I1 is at "1" level. Similarly, when the bit line potential VB is 3 V or 5 V, the transistor 100 is turned on and the junction between the transistors 100 and 101 is discharged to the reference potential Vs by the transistor 100. In this case, the output signal S1 of the inverter circuit I1 is at "1" level.

In the sense amplifier SA2 shown in FIG. 18B, the threshold voltage of the transistor 102 is set at 2 V. When the bit line potential VB is 0 V or 1.5 V, the transistor 102 is turned off, and the junction between the transistors 102 and 103 is charged to VC by the transistor 103. Accordingly, the output signal S2 of the inverter circuit I2 is at "0" level. When the bit line potential VB is 3 V or 5 V, the transistor 102 is turned on and the junction between the transistors 102 and 103 is discharged to the reference potential Vs by the transistor 102. In this case, the output signal S2 of the inverter circuit I2 is at "1" level.

In the sense amplifier SA3 shown in FIG. 18C, the threshold voltage of the transistor 104 is set at 3.5 V. When the bit line potential VB is 0 V, 1.5 V or 3 V, the transistor 104 is turned off, and the junction between the transistors 104 and 105 is charged to VC by the transistor 105. Accordingly, the output signal S3 of the inverter circuit I3 is at "0" level. When the bit line potential VB is 5 V, the transistor 104 is turned on and the potential at the junction between the transistors 104 and 105 is discharged to the reference potential Vs by the transistor 104. In this case, the output signal S3 of the inverter circuit I3 is at "1" level.

The output signals S1, S2 and S3 of the sense amplifiers SA1, SA2 and SA3 are supplied to the logic circuit 86, and the two-bit data items D1 and D2 stored in the selected memory cell are output from the output terminals of the inverter circuit 84 and NAND circuit 85 of the logic circuit 86. For example, when all output signals S1 to S3 of the sense amplifiers SA1 to SA3 are at "0" level, all outputs from the NAND circuits 82 and 83 and inverter circuit 81 are at "1" level. Accordingly, outputs from both inverter circuit 84 and NAND circuit 85 supplied with these "1" level outputs are at "0" level. Thus, data of two bits of D1="0" and D2="0" stored in the memory cell are obtained.

When the memory cell having the threshold voltage of 3.5 V and storing data (0, 1) is selected, the potential VB of the selected bit line is 1.5 V and signals S1="1", S2="0" and S3="0" are output from the sense amplifiers SA1 to SA3. Accordingly, the output signal from the NAND circuit 82 is at "1" level, and the output signal from the NAND circuit 83 receiving two "1" level input signals is at "0" level. The "1" level signal from the NAND circuit 82 is inverted by the inverter circuit 84 and the inverter circuit 84 outputs a "0" level signal. The output signal from the NAND circuit 85, which receives the "0" level signal from the NAND circuit 83 and the "1" level signal from the inverter circuit 81, is at "1" level. Thus, D1="0" is obtained as output signal from the inverter circuit 84, and D2="1" is obtained as output signal from the NAND circuit 85.

When the memory cell having the threshold voltage of 2 V and storing data (1, 0) is selected, the potential VB of the selected bit line is 3 V and signals S1="1", S2="1" and S3="0" are output from the sense amplifiers SA1 to SA3. Accordingly, the output signal from the NAND circuit 82 supplied with signals S1 and S2 is at "0" level. The output signal from the NAND circuit 83 receiving the signal S1 and a "0" level signal obtained from the inverter circuit 80 which has received the "1" level signal S2 is at "1" level. The "0" level signal from the NAND circuit 82 is inverted by the inverter circuit 84 and the inverter circuit 84 outputs a "1" level signal. The "0" level signal S3 is inverted by the inverter circuit 81 and a "1" level signal obtained from the inverter circuit 81 is supplied to one of the input terminals of the NAND circuit 85. The other input terminal of the NAND circuit 85 receives the "1" level signal output from the NAND circuit 83. Accordingly, the output signal of the NAND circuit 85 is at "0" level. Thus, D1="1" is obtained as output signal from the inverter circuit 84, and D2="0" is obtained as output signal from the NAND circuit 85.

When the memory cell having the threshold voltage of 0 V and storing data (1, 1) is selected, the potential VB of the selected bit line is 5 V and signals S1="1", S2="1" and S3="1" are output from the sense amplifiers SA1 to SA3. Accordingly, the output signal from the NAND circuit 82 supplied with signals S1 and S2 is at "0" level. The output signal from the NAND circuit 83 receiving the signal S1 and a "0" level signal obtained from the inverter circuit 80 is at "1" level. The "0" level signal from the NAND circuit 82 is inverted by the inverter circuit 84 and the inverter circuit 84 outputs a 11111 level signal. The output signal from the NAND circuit 85 receiving the "1" level signal from the NAND circuit 83 and the "0" level signal S3 output from the inverter circuit 81 is at "1" level. Thus, Di="1" is obtained as output signal from the inverter circuit 84, and D2="1" is obtained as output signal from the NAND circuit 85.

As has been described above, data of two bits can be output in accordance with the four threshold voltages set in the memory cells. The two-bit data D1 and D2 may be output as two-bit data associated with the same address, or may be output as two-bit data associated with different addresses, as shown in the prior art. If two data of sequential addresses are stored in one memory cell, the data of the sequential addresses may be read out at high speed. Specifically, while a data of the first address and a data of the second address are sequentially output from an output buffer circuit after one memory cell is read, data of the third and fourth addresses can be read from the other memory cell. Thus, the data of the sequential addresses can be apparently read out at high speed.

Besides, data corresponding to sequential four addresses are simultaneously read out from two memory cells, and data are read out from the next two memory cells while the data of the sequential four addresses are being output from an output buffer circuit, thus the data read-out speed is further increased.

In the case where the threshold voltage of the transistor of the memory cell differs from that of each transistor of the sense amplifier, the sense amplifier for detecting data needs to be provided with transistors having specified threshold voltages and the number of manufacturing steps increases in order to fabricate such transistors of the sense amplifiers. However, since the memory cells can be manufactured up to the stage immediately prior to data write, the time period from the reception of a user's order to the delivery of finished products will not change.

Figure 20:
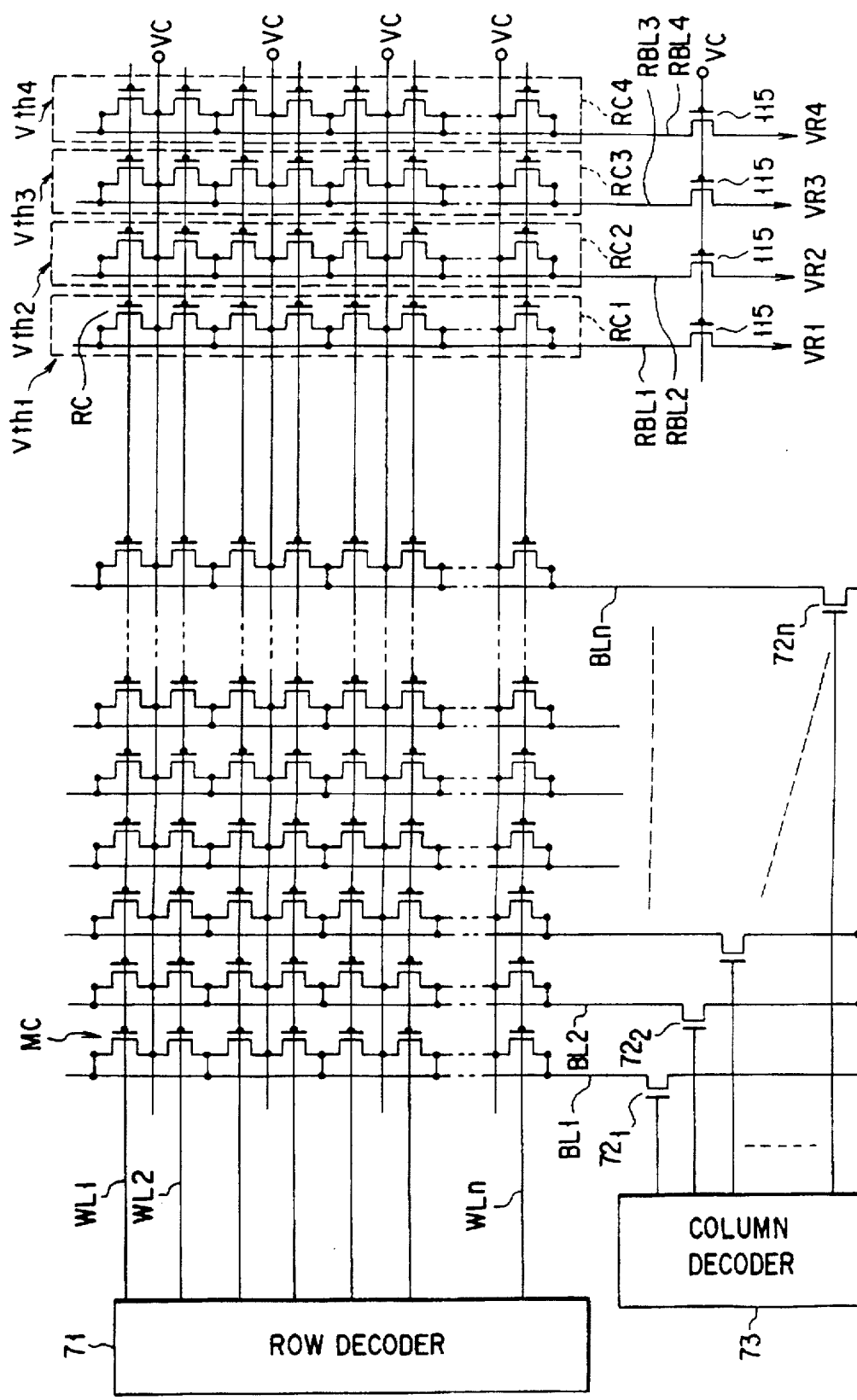
FIG. 20 shows a part of a second embodiment of the data read-out circuit applied to the memory cell of the present invention.

FIGS. 20 and 21 show a second embodiment of the read-out circuit. The structural elements common to those in the first embodiment are denoted by like reference numerals. In the second embodiment, differential sense amplifiers are used. The differential sense amplifiers include transistors having threshold voltages equal to those of the memory cells. Thus, there is no need to use transistors having specified threshold voltages for detecting data.

In FIG. 20, the memory cell MC has one of four threshold voltages Vth1, Vth2, Vth3 and Vth4, and these threshold voltages have the relationship of Vth1>Vth2>Vth3>Vth4. As compared with, for example, the embodiment shown in FIGS. 6A to 9B, FIG. 6B corresponds to Vth1, FIG. 7B to Vth2, FIG. 8B to Vth3, and FIG. 9B to Vth4.

Reference bit lines RBL1 to RBL4 are arranged to intersect at right angles with the word lines WL1, WL2 ... WLn. Reference cell groups RC1 to RC4 are connected to the reference bit lines RBL1 to RBL4, respectively. The reference cell groups RC1 to RC4 comprise reference cells RC equivalent to the memory cells. The reference cell groups RC1 to RC4 generate reference voltages for reading data from the memory cells MC.

Specifically, the reference bit line RBL1 is connected to the sources of transistors constituting the reference cells equivalent to the memory cells having the threshold voltage Vth1. The reference bit line RBL2 is connected to the sources of transistors constituting the reference cells equivalent to the memory cells having the threshold voltage Vth2. The reference bit line RBL3 is connected to the sources of transistors constituting the reference cells equivalent to the memory cells having the threshold voltage Vth3. The reference bit line RBL4 is connected to the sources of transistors constituting the reference cells equivalent to the memory cells having the threshold voltage Vth4. The gates of the transistors constituting the reference cell groups RC1 to RC4 are connected to the word lines WL1, WL2 ... WLn.

Transistors 115 equivalent to the transistors $72_1, 72_2 ... 72_n$ are connected to the reference bit lines RBL1 to RBL4. The gates of these transistors 115 are supplied with a power supply voltage VC. When one of the word lines is selected, reference voltages VR1, VR2, VR3 and VR4 are output from the transistors constituting the reference cell groups RC1 to RC4 connected to the selected word line. The reference voltages VR1 to VR4 are supplied to the sense amplifiers SA1, SA2 and SA3 shown in FIG. 21 through the transistors 115.

In FIG. 21, N-channel enhancement type transistors 110 and 111 are connected in series between an input terminal (hereinafter referred to as "common bit line L1") supplied with the bit line potential VB and a reference potential Vs. The transistor 110 constitutes a kind of load to the memory cell. A voltage which is slightly higher than the threshold voltage of this transistor 110 is applied to the gate of the transistor 110 so that the transistor 110 operates in a pentode region. Thus, a voltage substantially proportional to a threshold voltage of the selected memory cell is output from the common bit line L1. The transistors 110 and 111 may be replaced with the discharging transistor 74 driven by pulse signals as shown in FIG. 16. In this case, each reference bit line may be discharged by the discharging transistor 74.

The gate of the transistor 111 is supplied with a chip enable signal CE. When the semiconductor memory device is in the standby state, the transistor 111 is turned off by the chip enable signal CE so that the consumed power may be reduced. The gate voltage to the transistor 110 is generated by a load circuit LD 114 and N-channel enhancement type transistors 112 and 113. The load circuit 114 and transistors 112 and 113 are connected in series between a terminal supplied with the power supply voltage VC and the reference potential Vs. The gate voltage of the transistor 110 is output from a junction between the load circuit 114 and the drain of the transistor 112. The gate of the transistor 112 is connected to the drain of the transistor 112. The gate of the transistor 113 is supplied with the chip enable signal CE. Like the transistor 111, the transistor 113 is turned off by the chip enable signal CE when this semiconductor memory device is in the standby state so that the consumed power may be reduced.

FIGS. 22A and 22B show examples of the load circuit 114. In FIG. 22A, the load circuit 114 comprises an N-channel depletion type transistor having a source and a gate connected to each other and having a drain connected to a power supply voltage VC. The source of the load circuit 114 is connected to the drain of the transistor 112. In FIG. 22B, the load circuit 114 comprises a P-channel enhancement type transistor having a gate connected to a reference potential Vs and having a source connected to a power supply voltage VC. The drain of the load circuit 114 is connected to the drain of the transistor 112.

As is shown in FIG. 21, the reference bit lines RBL1 to RBL4 shown in FIG. 20 are connected to a reference potential Vs through transistors 116 and 117 equivalent to the transistors 110 and 111 connected to the bit lines of the memory cells. In addition, the reference bit lines RBL1 to RBL4 are connected to sense amplifiers SA1, SA2 and SA3. The gate of each transistor 116 is connected to the gate of the transistor 110, and the gate of each transistor 117 is connected to the gate of the transistor 111.

The sense amplifiers SA1, SA2 and SA3 are differential sense amplifiers. The sense amplifiers SA1, SA2 and SA3 comprise, respectively, four P-channel transistors P1 to P4, four P-channel transistors P5 to P8, and four P-channel transistors P9 to P12, and also comprise, respectively, two N-channel transistors N1 and N2, two N-channel transistors N3 and N4, and two N-channel transistors N5 and N6. In each of the sense amplifiers SA1 to SA3, each of two input terminals is constituted by two P-channel transistors. The common bit line L1 is connected to the gates of the transistors Pi and P2 constituting one input terminal of the sense amplifier SA1, the gates of the transistors P5 and P6 constituting one input terminal of the sense amplifier SA2, and the gates of the transistors P9 and P10 constituting one input terminal of the sense amplifier SA3. The transistors P3 and P4 constituting the other input terminal of the sense amplifier SA1 are connected to the reference bit lines RBL and RBL2, respectively. The transistors P7 and P8 constituting the other input terminal of the sense amplifier SA2 are connected to the reference bit lines RBL2 and RBL3, respectively. The transistors P11 and P12 constituting the other input terminal of the sense amplifier SA3 are connected to the reference bit lines RBL3 and RBL4, respectively. For example, the transistors Pi and P2 connected to the common bit line L1 may be constituted by a single transistor.

Since the threshold voltages have the relationship, Vth1>Vth2>Vth3>Vth4, the potentials of the reference bit lines have the relationship, VR1<VR2<VR3<VR4. The potential VR1 is equal to the bit line potential at the time the memory cell of threshold voltage Vth1 is selected. The potential VR2 is equal to the bit line potential at the time the memory cell of threshold voltage Vth2 is selected. The potential VR3 is equal to the bit line potential at the time the memory cell of threshold voltage Vth3 is selected. The potential VR4 is equal to the bit line potential at the time the memory cell of threshold voltage Vth4 is selected.

In general, the P-channel transistors P1 to P12 constituting the sense amplifiers have the same dimensions, and also the N-channel transistors N1 to N6 have the same dimensions. Needless to say, however, the dimensions of transistors P1 to P4 or transistors N1 and N2 of one sense amplifier may be changed according to a bit line potential to be detected. Furthermore, needless to say, the dimensions of these transistors and the dimensions of the transistor 116 connected to each reference bit may be adjusted to optimal values in the manufacturing process in accordance with the desired read-out speed. In the following description, it is assumed that the transistors P1 to P12 have the same dimensions.

The output terminals of the sense amplifiers SA1, SA2 and SA3 are connected to input terminals of inverter circuits I11, I12 and I13, respectively. The inverter circuits I11, I12 and I13 produce output signals S1, S2 and S3 which are the same as the signals S1, S2 and S3 shown in FIG. 17. Using the same logic circuit as the logic circuit 86 shown in FIG. 17, data D1 and D2 are generated. In the present embodiment, like the first embodiment, data (0, 0) are stored in the memory cell with the highest threshold voltage, data (0, 1) are stored in the memory cell with the second highest threshold voltage, data (1, 0) are stored in the memory cell with the third highest threshold voltage, and data (1, 1) are stored in the memory cell with the fourth highest or the lowest threshold voltage.

The operation of the above structure will now be described. When the memory cell MC having the threshold voltage Vth1 is selected, the potential VB of the common bit line L1 is lowest and substantially equal to the reference voltage VR1. Thus, the gate potentials of the transistors P1 and P2 connected to the common bit line L1 or one input terminal of the sense amplifier SA1 are VR1, and the gate potentials of the transistors P3 and P4 connected to the reference bit lines RBL1 and RBL2 or the other input terminal of the sense amplifier SA1 are VR1 and VR2. Since the gate potential of the transistor P4 is higher than that of each of the transistors P1, P2 and P3, the current flowing through the transistor P4 is smaller than that flowing through the transistors P1, P2 and P3. Accordingly, the sum of currents flowing through the transistors P1 and P2 of the sense amplifier SA1 is greater than that of currents flowing through the transistors P3 and P4, and as a result the output signal of the sense amplifier SA1 including the transistors P1 and P2 is at "1" level. Thus, the output signal S1 of the inverter circuit I11 supplied with the output signal of the sense amplifier SA1 is at "0" level.

Similarly, in the sense amplifier SA2, the gate potentials of the transistors P5 and P6 connected to the common bit line L1 or one input terminal of the sense amplifier SA2 are VR1, and the gate potentials of the transistors P7 and P8 connected to the reference bit lines RBL2 and RBL3 or the other input terminal of the sense amplifier SA2 are VR2 and VR3. Since the gate potential of each of the transistors P7 and P8 is higher than that of each of the transistors P5 and P6, the current flowing through each of the transistors P7 and is P8 is smaller than that flowing through each of the transistors P5 and P6. Accordingly, the sum of currents flowing through the transistors P5 and P6 of the sense amplifier SA2 is greater than that of currents flowing through the transistors P7 and P8, and as a result the output signal of the sense amplifier SA2 including the transistors P5 and P6 is at "1" level. Thus, the output signal S2 of the inverter circuit I12 supplied with the output signal of the sense amplifier SA2 is at "0" level.

In the sense amplifier SA3, the gate potentials of the transistors P9 and P10 connected to the common bit line L1 or one input terminal of the sense amplifier SA3 are VR1, and the gate potentials of the transistors P11 and P12 connected to the reference bit lines RBL3 and RBL4 or the other input terminal of the sense amplifier SA3 are VR3 and VR4. Since the gate potential of each of the transistors P11 and P12 is higher than that of each of the transistors P9 and P10, the current flowing through each of the transistors P11 and P12 is smaller than that flowing through each of the transistors P9 and P10. Accordingly, the sum of currents flowing through the transistors P9 and P10 of the sense amplifier SA3 is greater than that of currents flowing through the transistors P11 and P12, and as a result the output signal of the sense amplifier SA3 including the transistors P9 and P10 is at "1" level. Thus, the output signal S3 of the inverter circuit I13 supplied with the output signal of the sense amplifier SA3 is at "0" level.

As has been described above, when the memory cell with the highest threshold voltage is selected, all output signals S1 to S3 of the inverter circuits I11 to I13 are at "0" level. Thus, like the embodiment shown in FIGS. 16 and 17, the data (0, 0) is read out.

When the memory cell with the threshold voltage Vth2 is selected, the potential VB of the common bit line L1 is substantially equal to VR2. In the sense amplifier SA1, the gate potential of each of the transistors P1 and P2 connected to the common bit line L1 is VR2, and the gate potential of each of the transistors P3 and P4 connected to the reference bit lines RBL1 and RBL2 are VR1 and VR2, respectively. Since the gate potential of the transistor P3 is lower than that of each of the transistors P1, P2 and P4, the current flowing through the transistor P3 is greater than that flowing through each of the transistors P1, P2 and P4. Accordingly, the sum of currents flowing through the transistors P1 and P2 of the sense amplifier SA1 is less than that of currents flowing through the transistors P3 and P4, and as a result the output signal of the sense amplifier SA1 including the transistors P1 and P2 is at "0" level. Thus, the output signal S1 of the inverter circuit I11 supplied with the output signal of the sense amplifier SA1 is at "1" level.

In the sense amplifier SA2, the gate potential of each of the transistors P5 and P6 connected to the common bit line L1 is VR2, and the gate potential of each of the transistors P7 and P8 connected to the reference bit lines RBL2 and RBL3 are VR2 and VR3, respectively. Since the gate potential of the transistor P8 is higher than that of each of the transistors P5, P6 and P7, the current flowing through the transistor P8 is less than that flowing through each of the transistors P5, P6 and P7 each having the gate potential VR2. Accordingly, the sum of currents flowing through the transistors P5 and P6 of the sense amplifier SA2 is greater than that of currents flowing through the transistors P7 and P8, and as a result the output signal of the sense amplifier SA2 including the transistors P5 and P6 is at "1" level. Thus, the output signal S2 of the inverter circuit I12 supplied with the output signal of the sense amplifier SA2 is at "0" level.

In the sense amplifier SA3, the gate potential of each of the transistors P9 and P10 connected to the common bit line L1 is VR2, and the gate potential of each of the transistors P11 and P12 connected to the reference bit lines RBL3 and RBL4 are VR3 and VR4, respectively. Since the gate potential of each of the transistors P11 and P12 is higher than that of each of the transistors P9 and P10, the current flowing through each of the transistors P11 and P12 is smaller than that flowing through each of the transistors P9 and P10. Accordingly, the sum of currents flowing through the transistors P9 and P10 of the sense amplifier SA3 is greater than that of currents flowing through the transistors P11 and P12, and as a result the output signal of the sense amplifier SA3 including the transistors P9 and P10 is at "1" level. Thus, the output signal S3 of the inverter circuit I13 supplied with the output signal of the sense amplifier SA3 is at "0" level.

As has been described above, the output signals of the inverter circuits I11 to I13 are S1="1" level, and S2=S3="0" level. Thus, like the embodiment shown in FIGS. 16 and 17, the data (0, 1) is read out.

When the memory cell with the threshold voltage Vth3 is selected, the potential of the common bit line L1 is substantially equal to VR3. In the sense amplifier SA1, the gate potential of each of the transistors P1 and P2 connected to the common bit line L1 is VR3, and the gate potential of each of the transistors P3 and P4 connected to the reference bit lines RBL1 and RBL2 are VR1 and VR2. Since the gate potential of each of the transistors P3 and P4 is lower than that of each of the transistors P1 and P2, the current flowing through each of the transistors P3 and P4 is greater than that flowing through each of the transistors P1 and P2. Accordingly, the sum of currents flowing through the transistors P1 and P2 of the sense amplifier SA1 is smaller than that of currents flowing through the transistors P3 and P4, and as a result the output signal of the sense amplifier SA1 including the transistors P1 and P2 is at "0" level. Thus, the output signal S1 of the inverter circuit I11 supplied with the output signal of the sense amplifier SA1 is at "1" level.

In the sense amplifier SA2, the gate potential of each of the transistors P5 and P6 connected to the common bit line L1 is VR3, and the gate potential of each of the transistors P7 and P8 connected to the reference bit lines RBL2 and RBL3 are VR2 and VR3. Since the gate potential of the transistor P7 is lower than that of each of the transistors P5, P6 and P8, the current flowing through the transistor P7 is greater than that flowing through each of the transistors P5, P6 and P8. Accordingly, the sum of currents flowing through the transistors P5 and P6 of the sense amplifier SA2 is smaller than that of currents flowing through the transistors P7 and P8, and as a result the output signal of the sense amplifier SA2 including the transistors P5 and P6 is at "0" level. Thus, the output signal S2 of the inverter circuit I12 supplied with the output signal of the sense amplifier SA2 is at "1" level.

In the sense amplifier SA3, the gate potential of each of the transistors P9 and P10 connected to the common bit line L1 is VR3, and the gate potential of each of the transistors P11 and P12 connected to the reference bit lines RBL3 and RBL4 are VR3 and VR4. Since the gate potential of the transistor P12 is higher than that of each of the transistors P9, P10 and P11, the current flowing through the transistor P12 is smaller than that flowing through each of the transistors P9, P10 and P11. Accordingly, the sum of currents flowing through the transistors P9 and P10 of the sense amplifier SA3 is greater than that of currents flowing through the transistors P11 and P12, and as a result the output signal of the sense amplifier SA3 including the transistors P9 and P10 is at "1" level. Thus, the output signal S3 of the inverter circuit I13 supplied with the output signal of the sense amplifier SA3 is at "0" level.

As has been described above, the output signals of the inverter circuits I11 to I13 are S1=S2="1" level, and S3="0" level. Thus, like the embodiment shown in FIGS. 16 and 17, the data (1, 0) is read out.

When the memory cell with the threshold voltage Vth4 is selected, the potential VB of the common bit line L1 is substantially equal to VR4. In the sense amplifier SA1, the gate potential of each of the transistors P1 and P2 connected to the common bit line L1 is VR4, and the gate potential of each of the transistors P3 and P4 connected to the reference bit lines RBL1 and RBL2 are VR1 and VR2. Since the gate potential of each of the transistors P3 and P4 is lower than that of each of the transistors P1 and P2, the current flowing through each of the transistors P3 and P4 is greater than that flowing through each of the transistors P1 and P2. Accordingly, the sum of currents flowing through the transistors P1 and P2 of the sense amplifier SA1 is less than that of currents flowing through the transistors P3 and P4, and as a result the output signal of the sense amplifier SA1 including the transistors P1 and P2 is at "0" level. Thus, the output signal S1 of the inverter circuit I11 supplied with the output signal of the sense amplifier SA1 is at "1" level.

In the sense amplifier SA2, the gate potential of each of the transistors P5 and P6 connected to the common bit line L1 is VR4, and the gate potential of each of the transistors P7 and P8 connected to the reference bit lines RBL2 and RBL3 are VR2 and VR3. Since the gate potential of each of the transistors P7 and P8 is lower than that of each of the transistors P5 and P6, the current flowing through each of the transistors P7 and P8 is greater than that flowing through each of the transistors P5 and P6 each having the gate potential VR4. Accordingly, the sum of currents flowing through the transistors P5 and P6 provided at one input terminal of the sense amplifier SA2 is smaller than that of currents flowing through the transistors P7 and P8 at the other input terminal of the sense amplifier SA2, and as a result the output signal of the sense amplifier SA2 including the transistors P5 and P6 is at "0" level. Thus, the output signal S2 of the inverter circuit I12 supplied with the output signal of the sense amplifier SA2 is at "1" level.

In the sense amplifier SA3, the gate potential of each of the transistors P9 and P10 connected to the common bit line L1 is VR4, and the gate potential of each of the transistors P11 and P12 connected to the reference bit lines RBL3 and RBL4 are VR3 and VR4. Since the gate potential of the transistor P11 is lower than that of each of the transistors P9, P10 and P12, the current flowing through the transistor P11 having the gate potential VR3 is greater than that flowing through each of the transistors P9, P10 and P12. Accordingly, the sum of currents flowing through the transistors P9 and P10 of the sense amplifier SA3 is less than that of currents flowing through the transistors P11 and P12, and as a result the output signal of the sense amplifier SA3 including the transistors P9 and P10 is at "0" level. Thus, the output signal S3 of the inverter circuit I13 supplied with the output signal of the sense amplifier SA3 is at "1" level.

As has been described above, the output signals of the inverter circuits I11 to I13 are S1=S2=S3="1" level. Thus, like the embodiment shown in FIGS. 16 and 17, the data (1, 1) is read out.

In the embodiment as shown in FIGS. 20 and 21, the four kinds of memory cells having four threshold voltages and the equivalent four kinds of reference cells are used to efficiently detect data stored in the memory cells. In this embodiment, the employed differential sense amplifiers are of the current mirror type, but the structure thereof is not limited to this. That is, any type of sense amplifier may be used if it can compare the sum of currents flowing through two transistors connected to the common bit line L1 with the sum of currents flowing through two transistors connected to different reference bit lines.

Figure 24:
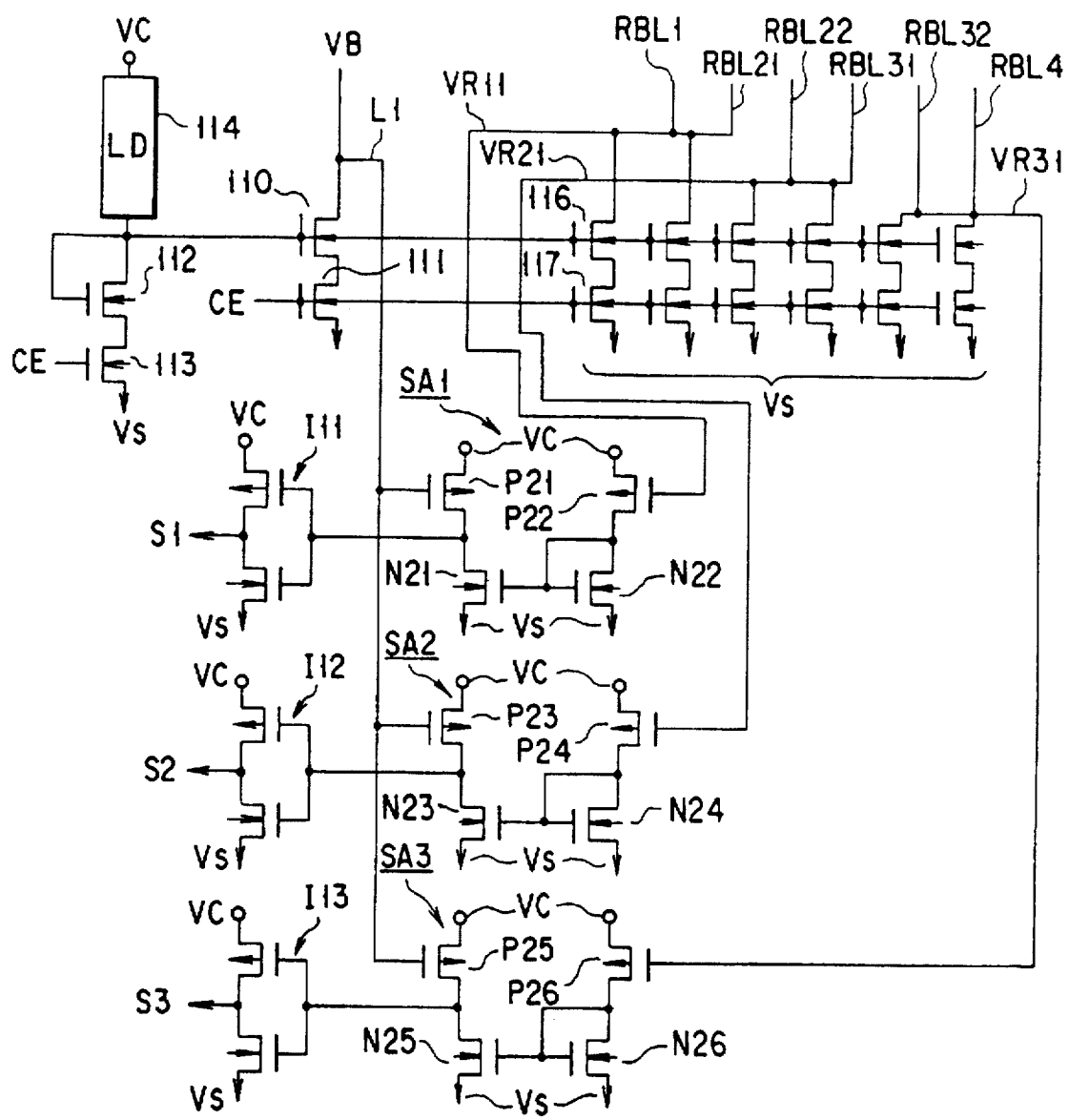
FIG. 24 shows another part of the third embodiment of the data read-out circuit as shown in FIG. 23.

FIGS. 23 and 24 show a third embodiment of the read-out circuit. The structural elements common to those in the second embodiment as shown in FIGS. 20 and 21 are denoted by like reference numerals. The third embodiment differs from the second embodiment with respect to the method of generating a reference voltage applied to the other input terminal of each of the differential sense amplifiers. In the third embodiment, there are provided two reference bit lines connected to reference cells with threshold voltage Vth2 and two reference bit lines connected to reference cells with threshold voltage Vth3. In FIG. 23, there are six reference bit lines RBL1, RBL21, RBL22, RBL31, RBL32 and RBL4 adjacent the memory cells MC. The reference bit line RBL1 is connected to a reference cell group RC1 comprising reference cells with threshold voltage Vth1. The reference bit lines RBL21 and RBL22 are connected to reference cell groups RC21 and RC22 comprising reference cells with threshold voltage Vth2. The reference bit lines RBL31 and RBL32 are connected to reference cell groups RC31 and RC32 comprising reference cells with threshold voltage Vth3. The reference bit line RBL4 is connected to a reference cell group RC4 comprising reference cells with threshold voltage Vth4.

The reference bit line RBL1 is connected to the reference bit line RBL21 to form a reference bit line VR11. A reference voltage VR11 is output from the reference bit line VR11. The reference voltage VR11 is higher than the bit line potential VR1 at the time the memory cell with threshold voltage Vth1 is selected and lower than the bit line potential VR2 at the time the memory cell with threshold voltage Vth2 is selected. Specifically, since the reference bit line connected to the reference cells with threshold voltage Vth1 is connected to the reference bit line connected to the reference cells with threshold voltage Vth2, the reference voltage VR11 which is between the bit line potentials VR1 and VR2 is obtained.

Similarly, the reference bit line RBL22 is connected to the reference bit line RBL31 to form a reference bit line VR21. A reference voltage VR21 is output from the reference bit line VR21. The reference voltage VR21 is higher than the bit line potential VR2 at the time the memory cell with threshold voltage Vth2 is selected and lower than the bit line potential VR3 at the time the memory cell with threshold voltage Vth3 is selected.

Further, the reference bit line RBL32 is connected to the reference bit line RBL4 to form a reference bit line VR31. A reference voltage VR31 is output from the reference bit line VR31. The reference voltage VR31 is higher than the bit line potential VR3 at the time the memory cell with threshold voltage Vth3 is selected and lower than the bit line potential VR4 at the time the memory cell with threshold voltage Vth4 is selected. Specifically, the four bit line voltages and the three reference voltages have the relationship: VR1<VR11<VR2<VR21<VR3<VR31<VR4.

As is shown in FIG. 24, a differential sense amplifier SA1 comprises P-channel transistors P21 and P22 and N-channel transistors N21 and N22, a differential sense amplifier SA2 comprises P-channel transistors P23 and P24 and N-channel transistors N23 and N24, and a differential sense amplifier SA3 comprises P-channel transistors P25 and P26 and N-channel transistors N25 and N26. The gates of the P-channel transistors P21, P23 and P25 each constituting one input terminal of the associated one of the sense amplifiers SA1, SA2 and SA3 are connected to the common bit line L1. On the other hand, the gates of the P-channel transistors P22, P24 and P26 each constituting the other input terminal of the associated one of the sense amplifiers SA1, SA2 and SA3 are connected to the reference bit lines VR11, VR21 and VR31, respectively.

The operation of the third embodiment with the above structure will now be described.

When the memory cell with the highest threshold voltage is selected, the potential VB of the common bit line L1 is set at VR1. Since the potential VR1 is lower than each of the reference voltages VR11, VR21 and VR31 of the reference bit lines VR11, VR21 and VR31, "1" level signals are output from the output terminals of the sense amplifiers SA1, SA2 and SA3. These output signals are delivered to the inverter circuits I11, I12 and I13. As with the case of the first and second embodiments of the read-out circuit, all the output signals S1, S2 and S3 of the inverter circuits I11, I12 and I13 are at "0" level.

When the potential VB of the common bit line L1 is VR2, the reference voltage VR11 supplied to the other input terminal of the sense amplifier SA1 is lower than the potential VR2. Thus, the output signal from the sense amplifier SA1 alone is at "0" level, and the output signal S1 of the inverter circuit I11 is at "1" level. At this time, the output signals S2 and S3 of the inverter circuits I12 and I13 are both at "0" level.

When the potential VB of the common bit line L1 is VR3, the reference voltages VR11 and VR21 supplied to the other input terminals of the sense amplifiers SA1 and SA2 are lower than the potential VR3. Thus, the output signals from both sense amplifiers SA1 and SA2 are at "0" level, and the output signals S1 and S2 of both inverter circuits I11 and I12 are at "1" level. Thus, the signals of S1=S2="1" level and S3="0" level are output and data is exactly read out.

When the potential VB of the common bit line L1 is VR4, the reference voltages VR11, V21 and VR31 supplied to the other input terminals of the sense amplifiers SA1, SA2 and SA3 are lower than the potential VR4. Thus, the output signals from the sense amplifiers SA1, SA2 and SA3 are at "0" level, and the output signals S1, S2 and S3 of the inverter circuits I11, I12 and I13 are at "1" level. Thus, the signals of S1=S2=S3="1" level are output and data is exactly read out.

In this embodiment, the reference bit line RBL1 connected to the reference cells with threshold voltage Vth1 is connected to the reference bit line RBL21 connected to the reference cells with threshold voltage Vth2, thereby producing the reference voltage VR11 at the other input terminal of the sense amplifier SA1. Thus, a voltage having a value between the VR1 and the VR2 can be exactly produced as reference voltage. Similarly, the reference bit line RBL22 connected to the reference cells with threshold voltage Vth2 is connected to the reference bit line RBL31 connected to the reference cells with threshold voltage Vth3, thereby producing the reference voltage VR21 at the other input terminal of the sense amplifier SA2. Thus, a voltage having a value between the VR2 and the VR3 can be exactly produced as reference voltage. Furthermore, the reference bit line RBL32 connected to the reference cells with threshold voltage Vth3 is connected to the reference bit line RBL4 connected to the reference cells with threshold voltage Vth4, thereby producing the reference voltage VR31 at the other input terminal of the sense amplifier SA3. Thus, a voltage having a value between the VR3 and the VR4 can be exactly produced as reference voltage.

Needless to say, in the present embodiment, too, in order to obtain an optimal read-out margin, each of the transistors 116 connected to the reference bit lines is finely adjusted to have optimal dimensions.

Figure 25:
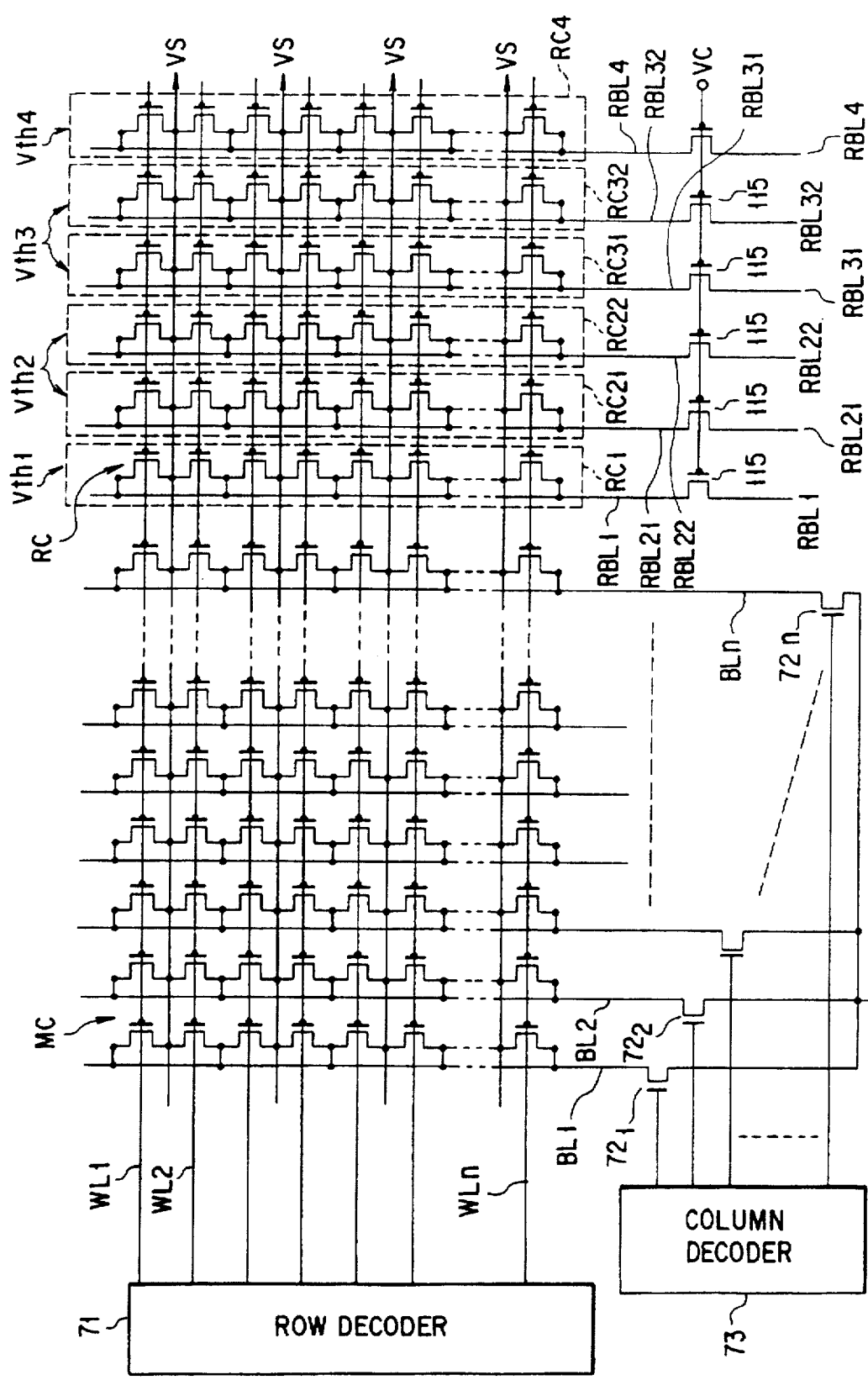
FIG. 25 shows a part of a fourth embodiment of the data read-out circuit applied to the memory cell of the present invention.
Figure 26:
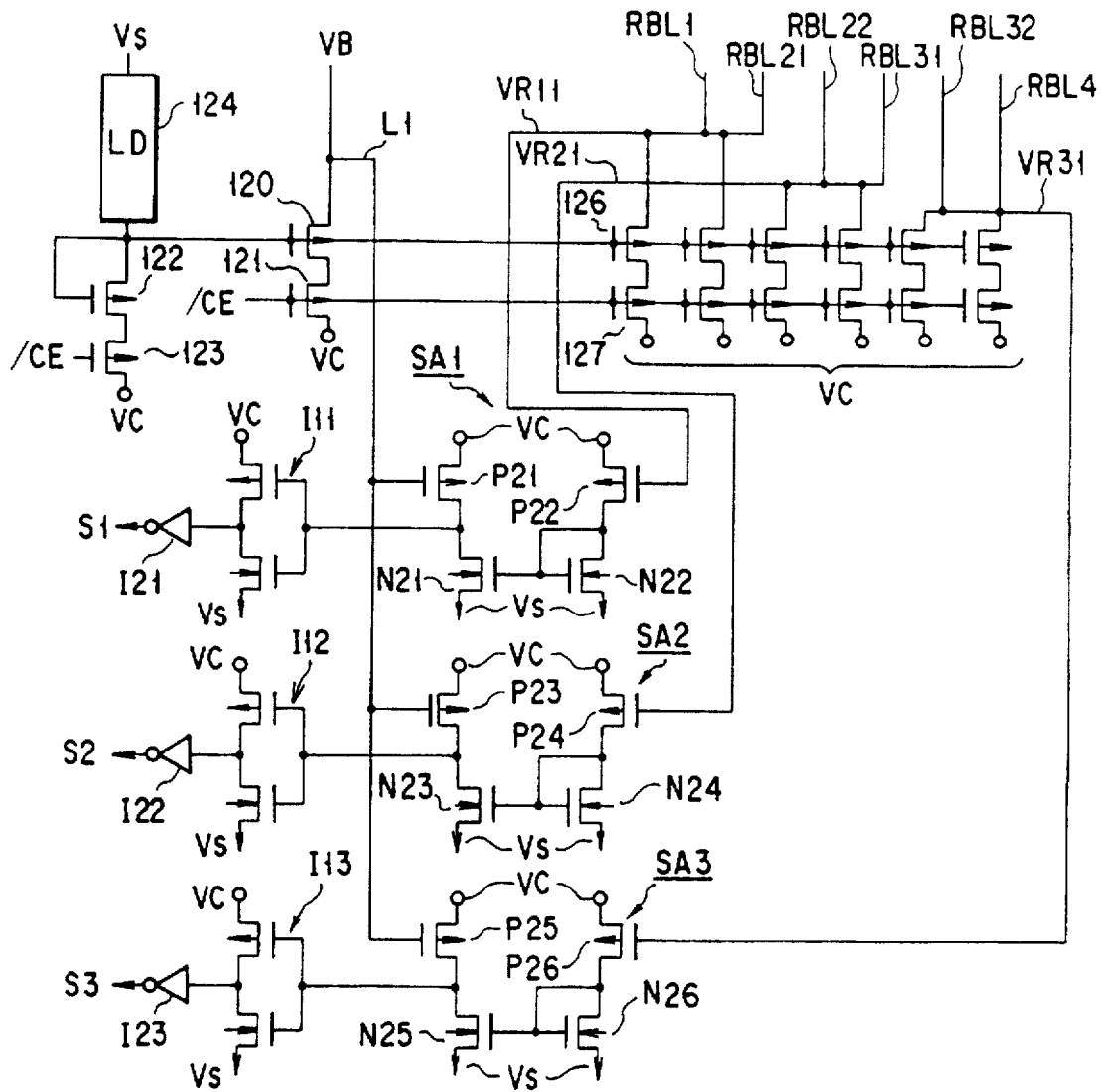
FIG. 26 shows another part of the fourth embodiment of the data read-out circuit as shown in FIG. 25.

FIGS. 25 and 26 show a fourth embodiment of the read-out circuit. In the fourth embodiment, the direction of currents flowing through the memory cells and reference cells in the third embodiment as shown in FIGS. 23 and 24 is reversed. The structural elements common to those in the third embodiment are denoted by like reference numerals.

In FIG. 25, the drains of the memory cells MC are connected to bit lines BL1, BL2 . . . BLn, and the drains of the reference cells RC are connected to reference bit lines RBL1, RBL21, RBL22, RBL31, RBL32 and RBL4. The sources of the memory cells MC and reference cells RC are connected to a reference potential Vs.

In FIG. 26, the N-channel transistors 110, 111, 112, 113, 116 and 117 shown in FIG. 24 are replaced by P-channel transistors 120, 121, 122, 123, 126 and 127, respectively. Of the series-connected transistors 120 and 121, the transistor 121 has a source connected to a power supply potential VC and a gate supplied with an inverted chip enable signal /CE. The transistor 120 has a drain connected to the common bit line L1 and a gate connected to one terminal of a load circuit 124. Of the series-connected transistors 122 and 123, the transistor 123 has a source connected to a power supply voltage VC and a gate supplied with an inverted chip enable signal /CE. The drain and gate of the transistor 122 are connected to the one terminal of the load circuit 124, and the other terminal of the load circuit 124 is connected to a reference potential Vs. The load circuit 124 may comprise an N-channel depletion type transistor having a gate connected to the reference potential vs.

Furthermore, of the series-connected transistors 126 and 127, each of the transistors 127 has a source connected to a power supply voltage VC and a gate supplied with an inverted chip enable signal /CE. The gates of the transistors 126 are connected to said one terminal of the load circuit 124 and the drains thereof are connected to the associated reference bit lines RBL1, RBL21, RBL22, RBL31, RBL32 and RBL4. Further, the output terminals of the inverter circuits I11, I12 and I13 are connected to inverter circuits I21, I22 and I23, respectively. Signals S1, S2 and S3 are output from the output terminals of the inverter circuits I21, I22 and I23.

In the above structure, since the direction of the currents flowing through the memory cells MC and reference cells RC is reverse to that in the third embodiment as shown in FIGS. 23 and 24, the output levels of the sense amplifiers SA1, SA2 and SA3 are reverse to those in the third embodiment. However, the same output levels can be obtained by virtue of the inverter circuits 121 to 123.

Specifically, when the memory cell with the highest threshold voltage Vth1 is selected, the potential VB of the common bit line L1 is set at a VR1. Since the potential VR1 is higher than each of the reference voltages VR11, VR21 and VR31, "0" level signals are output from the output terminals of the sense amplifiers SA1, SA2 and SA3. These output signals are delivered to the inverter circuits I11 to I13 and I21 to I23. The output signals S1, S2 and S3 of the inverter circuits I21, I22 and I23 are at "0" level, as in the first and second embodiments of the read-out circuit.

When the memory cell with the threshold voltage Vth2 is selected, the potential VB of the common bit line L1 is set at a VR2, the reference voltage VR11 applied at the other input terminal of the sense amplifier SA1 is higher than the potentials VR2. Thus, the output signal from the sense amplifier SA1 alone is at "1" level, and the output signal S1 of the inverter circuit I21 is at "1" level. At this time, the output signals S2 and S3 of the inverter circuits I22 and I23 are both at "0" level.

When the memory cell with the threshold voltage Vth3 is selected, the potential VB of the common bit line L1 is a VR3, the reference voltages VR11 and VR21 supplied to the other input terminals of the sense amplifiers SA1 and SA2 are higher than the potential VR3. Thus, the output signals from both sense amplifiers SA1 and SA2 are at "1" level, and the output signals S1 and S2 of both inverter circuits I21 and I22 are at "1" level. Thus, the signals of S1=S2="1" level and S3="0" level are output and data is exactly read out.

When the memory cell with the lowest threshold voltage Vth4 is selected, the potential VB of the common bit line L1 is a VR4, the reference voltages VR11, V21 and VR31 supplied to the other input terminals of the sense amplifiers SA1, SA2 and SA3 are higher than the potential VR4. Thus, the output signals from the sense amplifiers SA1, SA2 and SA3 are at "1" level, and the output signals S1, S2 and S3 of the inverter circuits I21, I22 and I23 are at "1" level. Thus, the signals of S1=S2=S3="1" level are output and data is exactly read out.

In FIG. 26, the inverter circuits I11 to I13 and I21 to I23 are connected to the output terminals of the sense amplifiers SA1, SA2 and SA3. However, without these inverter circuits, data can be read out exactly.

In the second embodiment as shown in FIGS. 20 and 21, like the fourth embodiment as shown in FIGS. 25 and 26, the memory cells and reference cells may be connected to the reference potential Vs, as will be described below.

The drains of the memory cells MC are connected to the bit lines BL1, BL2 to BLn, and the drains of the reference cells RC are connected to the reference bit lines RBL1, RBL2, RBL3 and RBL4. The sources of the memory cells MC and reference cells RC are connected to the reference potential vs.

Like the structure as shown in FIG. 26, the N-channel transistors 110, 111, 112, 113, 116 and 117 shown in FIG. 21 are replaced by P-channel transistors. One terminal of each of the series-connected transistors is connected to the power supply voltage VC in place of the reference potential Vs, as with the structure shown in FIG. 26. In addition, the inverted chip enable signal /CE is substituted for the chip enable signal CE.

Similarly, the other terminals of the series-connected P-channel transistors 110 and 111 and P-channel transistors 116 and 117 are connected to the common bit line L1 and reference bit lines RBL1, RBL2, RBL3 and RBL4, respectively. The other terminal of the load circuit is connected to the reference potential vs.

That is, the same structure as that of transistors 122 and 123 and load circuit 124 shown in FIG. 26 is used. Furthermore, as with the structure of FIG. 26, additional inverter circuits are connected to the inverter circuits I11, I12 and I13. Signals S1, S2 and S3 are output from the output terminals of these additional inverter circuits.

In the above structure, since the direction of currents flowing through the memory cells MC and reference cells RC is reverse to that in the second embodiment shown in FIGS. 20 and 21, the logic output levels of the sense amplifiers SA1, SA2 and SA3 are reverse to those in the second embodiment. However, the same output levels as in the second embodiment can be obtained through the inverter circuits.

As has been described above, in the present invention, the impurity-doped area of the channel region is varied according to data stored in the memory cell. Thereby, the substantial channel width or channel length of the memory cell is varied. In addition, the threshold voltage of the memory cell is varied by changing the impurity-doped area of the channel region. Accordingly, data of plural bits can be stored in one memory cell. In addition, after gate electrodes are formed in a plurality of memory cells, data of plural bits can be written in the memory cells by making use of a single glass mask. Therefore, without substantially increasing the number of manufacturing steps after the formation of the gate electrode, finished products can be delivered to the users in a short time period without an increase in cost.

Besides, data of plural bits is stored in a memory cell having a specified threshold voltage. The drain of the memory cell is connected to a power supply voltage and the potential of the bit line connected to the source of the memory cell is detected to read out data of the memory cell. Thus, the difference in threshold voltage of the memory cell is exactly output as a bit line potential difference, and the data stored in the memory cell can be detected with a large margin.

Furthermore, reference cells equivalent in structure to the memory cells are used to produce reference voltages. Thus, the reference voltages can be produced easily and exactly. In addition, since the reference bit lines connected to reference cells with different threshold voltages are connected, an intermediate voltage having a value between output voltages of the memory cells can be produced exactly. By using the produced intermediate voltage as a reference voltage of the sense amplifier, the structure of the sense amplifier can be simplified.

What is claimed is:

1. A semiconductor memory device comprising:

row lines;

a plurality of memory cells each having a current path, one end of the current path being connected to a first power supply, said memory cell being driven by the associated one of said row lines, each memory cell having one of four threshold voltages and storing data of two bits;

a column line connected to the other end of the current path of each of the memory cells;

first dummy cells equivalent in structure to said memory cells, each having a current path, one end of the current path being connected to the first power supply, said first dummy cells being driven by the associated one of said row lines, each of said first dummy cells having a first threshold voltage which is the highest of said four threshold voltages;

a first dummy column line connected to the other end of the current path of each of the first dummy cells;

second dummy cells equivalent in structure to said memory cells, each having a current path, one end of the current path being connected to the first power supply, said second dummy cells being driven by the associated one of said row lines, each of said second dummy cells having a second threshold voltage which is the second highest of said four threshold voltages;

a second dummy column line connected to the other end of the current path of each of the second dummy cells;

third dummy cells equivalent in structure to said memory cells, each having a current path, one end of the current path being connected to the first power supply, said third dummy cells being driven by the associated one of said row lines, each of said third dummy cells having a third threshold voltage which is the third highest of said four threshold voltages;

a third dummy column line connected to the other end of the current path of each of the third dummy cells;

fourth dummy cells equivalent in structure to said memory cells, each having a current path, one end of the current path being connected to the first power supply, said fourth dummy cells being driven by the associated one of said row lines, each of said fourth dummy cells having a fourth threshold voltage which is the lowest of said four threshold voltages;

a fourth dummy column line connected to the other end of the current path of each of the fourth dummy cells;

a first data sense circuit having one end connected to said column line and the other end connected to said first and second dummy column lines, said first data sense circuit comparing the potential of said column line and the potentials of said first and second dummy column lines and outputting a signal;

a second data sense circuit having one end connected to said column line and the other end connected to said second and third dummy column lines, said second data sense circuit comparing the potential of said column line and the potentials of said second and third dummy column lines and outputting a signal;

a third data sense circuit having one end connected to said column line and the other end connected to said third and fourth dummy column lines, said third data sense circuit comparing the potential of said column line and the potentials of said third and fourth dummy column lines and outputting a signal; and a logic circuit connected to output terminals of said first, second and third data sense circuits, said logic circuit receiving the output signals from the first, second and third data sense circuits and out-putting data of two bits stored in the memory cells.

2. The device according to claim 1, wherein said first data sense circuit comprises:

first and second transistors of a first conductivity type having gates connected to said column line, sources connected to the first power supply and drains connected to each other;

a third transistor of the first conductivity type having a gate connected to said first dummy column line and a source connected to said first power supply;

a fourth transistor of the first conductivity type having a gate connected to said second dummy column line, a source connected to said first power supply, and a drain connected to the drain of said third transistor;

a first transistor of a second conductivity type having a drain connected to the drains of said first and second transistors, a source connected to a second power supply, and a gate connected to the drains of said third and fourth transistors; and a second transistor of the second conductivity type having a drain and a gate connected to the drains of said third and fourth transistors, and a source connected to the second power supply, said second data sense circuit comprises:

fifth and sixth transistors of a first conductivity type having gates connected to said column line, sources connected to a first power supply and drains connected to each other;

a seventh transistor of the first conductivity type having a gate connected to said second dummy column line and a source connected to said first power supply;

an eighth transistor of the first conductivity type having a gate connected to said third dummy column line, a source connected to said first power supply, and a drain connected to the drain of said seventh transistor;

a third transistor of a second conductivity type having a drain connected to the drains of said fifth and sixth transistors, a source connected to a second power supply, and a gate connected to the drains of said seventh and eighth transistors; and a fourth transistor of the second conductivity type having a drain and a gate connected to the drains of said seventh and eighth transistors, and a source connected to the second power supply, and said third data sense circuit comprises:

ninth and tenth transistors of a first conductivity type having gates connected to said column line, sources connected to a first power supply and drains connected to each other;

an eleventh transistor of the first conductivity type having a gate connected to said third dummy column line and a source connected to said first power supply;

a twelfth transistor of the first conductivity type having a gate connected to said fourth dummy column line, a source connected to said first power supply, and a drain connected to the drain of said eleventh transistor;

a fifth transistor of a second conductivity type having a drain connected to the drains of said ninth and tenth transistors, a source connected to a second power supply, and a gate connected to the drains of said eleventh and twelfth transistors; and a sixth transistor of the second conductivity type having a drain and a gate connected to the drains of said eleventh and twelfth transistors, and a source connected to the second power supply.

3. A semiconductor memory device comprising:

row lines;

a plurality of memory cells each having a current path, one end of the current path being connected to a first power supply, said memory cell being driven by the associated one of said row lines, each memory cell having one of four threshold voltages and storing data of two bits;

a column line connected to the other end of the current path of each of the memory cells;

first dummy cells equivalent in structure to said memory cells, each having a current path, one end of the current path being connected to the first power supply, said first dummy cells being driven by the associated one of said row lines, each of said first dummy cells having a first threshold voltage which is the highest of said four threshold voltages;

a first dummy column line connected to the other end of the current path of each of the first dummy cells;

second dummy cells equivalent in structure to said memory cells, each having a current path, one end of the current path being connected to the first power supply, said second dummy cells being driven by the associated one of said row lines, each of said second dummy cells having a second threshold voltage which is the second highest of said four threshold voltages;

a second dummy column line connected to the other end of the current path of each of the second dummy cells and connected to said first dummy column line;

third dummy cells equivalent in structure to said memory cells, each having a current path, one end of the current path being connected to the first power supply, said third dummy cells being driven by the associated one of said row lines, each of said third dummy cells having the second threshold voltage which is the second highest of said four threshold voltages;

a third dummy column line connected to the other end of the current path of each of the third dummy cells;

fourth dummy cells equivalent in structure to said memory cells, each having a current path, one end of the current path being connected to the first power supply, said fourth dummy cells being driven by the associated one of said row lines, each of said fourth dummy cells having a third threshold voltage which is the third highest of said four threshold voltages;

a fourth dummy column line connected to the other end of the current path of each of the fourth dummy cells and connected to said third dummy column line;

fifth dummy cells equivalent in structure to said memory cells, each having a current path, one end of the current path being connected to the first power supply, said fifth dummy cells being driven by the associated one of said row lines, each of said fifth dummy cells having the third threshold voltage which is the third highest of said four threshold voltages;

a fifth dummy column line connected to the other end of the current path of each of the fifth dummy cells;

sixth dummy cells equivalent in structure to said memory cells, each having a current path, one end of the current path being connected to the first power supply, said sixth dummy cells being driven by the associated one of said row lines, each of said sixth dummy cells having a fourth threshold voltage which is the lowest of said four threshold voltages;

a sixth dummy column line connected to the other end of the current path of each of the sixth dummy cells and connected to the fifth dummy column line;

a first data sense circuit having one end connected to said column line and the other end connected to said connected first and second dummy column lines, said first data sense circuit comparing the potential of said one end and the potential of said other end and outputting corresponding data;

a second data sense circuit having one end connected to said column line and the other end connected to said connected third and fourth dummy column lines, said second data sense circuit comparing the potential of said one end and the potential of said other end and outputting a signal;

a third data sense circuit having one end connected to said column line and the other end connected to said connected fifth and sixth dummy column lines, said third data sense circuit comparing the potential of said one end and the potential of said other end and outputting a signal; and a logic circuit connected to output terminals of said first, second and third data sense circuits, said logic circuit receiving the output signals from the first, second and third data sense circuits and outputting data of two bits stored in the memory cells.

4. The device according to claim 3, wherein said first data sense circuit comprises:

a first transistor of a first conductivity type having a gate connected to said column line and a source connected to a first power supply;

a second transistor of the first conductivity type having a gate connected to said first and second dummy column lines and a source connected to said first power supply;

a first transistor of a second conductivity type having a drain connected to the drain of said first transistor, a source connected to a second power supply, and a gate connected to the drain of said second transistor; and a second transistor of the second conductivity type having a drain and a gate connected to the drain of said second transistor, and a source connected to the second power supply, said second data sense circuit comprises:

a third transistor of a first conductivity type having a gate connected to said column line and a source connected to a first power supply;

a fourth transistor of the first conductivity type having a gate connected to said third and fourth dummy column lines and a source connected to said first power supply;

a third transistor of a second conductivity type having a drain connected to the drain of said third transistor, a source connected to a second power supply, and a gate connected to the drain of said fourth transistor; and a fourth transistor of the second conductivity type having a drain and a gate connected to the drain of said fourth transistor, and a source connected to the second power supply, and said third data sense circuit comprises:

a fifth transistor of a first conductivity type having a gate connected to said column line and a source connected to a first power supply;

a sixth transistor of the first conductivity type having a gate connected to said fifth and sixth dummy column lines and a source connected to said first power supply;

a fifth transistor of a second conductivity type having a drain connected to the drain of said fifth transistor, a source connected to a second power supply, and a gate connected to the drain of said sixth transistor; and a sixth transistor of the second conductivity type having a drain and a gate connected to the drain of said sixth transistor, and a source connected to the second power supply.

5. The device according to claim 3, further comprising discharging means connected between a second power supply and each of said first to sixth dummy column lines and said column line, for discharging each of said first to sixth dummy column lines and said column line, wherein a voltage supplied from said second power supply is lower than a voltage supplied from said first power supply.

6. The device according to claim 3, further comprising charging means connected between said first power supply and each of said first to sixth dummy column lines and said column line, for charging each of said first to sixth dummy column lines and said column line.

* * * * *